(12) United States Patent
Banna et al.

(10) Patent No.: US 10,199,429 B2
(45) Date of Patent: Feb. 5, 2019

(54) LEDS WITH THREE COLOR RGB PIXELS FOR DISPLAYS

(71) Applicant: GLOBALFOUNDRIES INC., Grand Cayman (KY)

(72) Inventors: Srinivasa Banna, San Jose, CA (US); Deepak Nayak, Union City, CA (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/901,850

(22) Filed: Feb. 21, 2018

(65) Prior Publication Data

US 2018/0197913 A1   Jul. 12, 2018

Related U.S. Application Data

(63) Continuation of application No. 15/599,458, filed on May 18, 2017, now Pat. No. 9,941,330.

(Continued)

(51) Int. Cl.
*H01L 21/00* (2006.01)
*H01L 27/15* (2006.01)
(Continued)

(52) U.S. Cl.
CPC .......... *H01L 27/156* (2013.01); *H01L 33/007* (2013.01); *H01L 33/0025* (2013.01);
(Continued)

(58) Field of Classification Search
None
See application file for complete search history.

(56) References Cited

U.S. PATENT DOCUMENTS

| | | | |
|---|---|---|---|
| 6,627,552 B1 * | 9/2003 | Nishio | ........... H01L 21/0242 117/3 |
| 7,582,498 B2 * | 9/2009 | D'Evelyn | ........... C30B 9/00 117/216 |

(Continued)

OTHER PUBLICATIONS

Furukawa, Yuzo, et al., Monolithic integration of light-emitting devices and silicon transistors, Micro/Nano Lithography, Nov. 19, 2007, SPIE.

(Continued)

*Primary Examiner* — Angel Roman
(74) *Attorney, Agent, or Firm* — Horizon IP PTE Ltd.

(57) ABSTRACT

Devices and methods of forming the devices are disclosed. The device includes a substrate and a color LED pixel disposed on the substrate. The color LED pixel includes a red LED, a green LED and a blue LED. Each of the color LED includes a specific color LED body disposed on the respective color region on the substrate, a specific color multiple quantum well (MQW) on the respective color LED body and a specific color top LED layer disposed over the respective color MQW. The MQWs of the red LED, green LED and blue LED includes at least an indium gallium nitride ($In_xGa_{1-x}N$) layer and a gallium nitride (GaN), where x is the atomic percentage of In in the $In_xGa_{1-x}N$ layer, and the MQWs of the red LED, green LED and blue LED have different bandgaps by varying x of the $In_xGa_{1-x}N$ layer in the red LED, the green LED and the blue LED.

20 Claims, 26 Drawing Sheets

Related U.S. Application Data

(60) Provisional application No. 62/337,901, filed on May 18, 2016, provisional application No. 62/337,899, filed on May 18, 2016, provisional application No. 62/355,895, filed on Jun. 29, 2016.

(51) Int. Cl.

| | |
|---|---|
| *H01L 33/06* | (2010.01) |
| *H01L 33/16* | (2010.01) |
| *H01L 33/32* | (2010.01) |
| *H01L 33/12* | (2010.01) |
| *H01L 33/62* | (2010.01) |
| *H01L 33/20* | (2010.01) |
| *H01L 33/00* | (2010.01) |
| *H01L 33/24* | (2010.01) |

(52) U.S. Cl.
CPC .............. *H01L 33/06* (2013.01); *H01L 33/12* (2013.01); *H01L 33/16* (2013.01); *H01L 33/20* (2013.01); *H01L 33/32* (2013.01); *H01L 33/62* (2013.01); *H01L 33/24* (2013.01); *H01L 2933/0066* (2013.01)

(56) References Cited

U.S. PATENT DOCUMENTS

| | | | |
|---|---|---|---|
| 8,163,581 B1 | 4/2012 | Or-Bach et al. | |
| 8,241,932 B1* | 8/2012 | Yu ........................ | H01L 25/0753 |
| | | | 257/E21.122 |
| 9,941,329 B2 | 4/2018 | Nayak et al. | |
| 2010/0006873 A1* | 1/2010 | Raring .................. | H01L 27/153 |
| | | | 257/90 |
| 2010/0081218 A1 | 4/2010 | Hardin | |
| 2012/0025232 A1 | 2/2012 | Gwo et al. | |
| 2014/0191249 A1 | 7/2014 | Blanchard et al. | |
| 2014/0206117 A1 | 7/2014 | Sonoda et al. | |
| 2014/0368772 A1 | 12/2014 | Hwang et al. | |
| 2014/0374742 A1 | 12/2014 | Tsang | |
| 2015/0295013 A1 | 10/2015 | Matsumoto et al. | |
| 2016/0093665 A1 | 3/2016 | Schubert et al. | |
| 2016/0095221 A1 | 3/2016 | Ramachandran et al. | |
| 2016/0164033 A1 | 6/2016 | Moon et al. | |
| 2017/0148756 A1 | 5/2017 | Yu et al. | |
| 2017/0358562 A1* | 12/2017 | Banna .................. | H01L 25/167 |

OTHER PUBLICATIONS

Vincent Lee, High Brightness Microdisplays by Monolithic Integration of III-V LEDs and Thin Film Silicon Transistors, International Display Workshop, Dec. 4, 2014, Slides 7 and 15, Niigata, Japan.

J. W. Chung et al., GaN-on-Si technology, a new approach for advanced devices in energy and communications, Solid-State Device Research Conference (ESSDERC), 2010 Proceedings of the European, Sep. 2010, pp. 52-56, IEEE, Sevilla, Spain.

T. Mak et al., Integration Scheme toward LED System-on-a-Chip (SoC), Light, Energy and the Environment, OSA Technical Digest, 2014, Optical Society of America.

Dong Zan et al., A 630dpi dynamic LED display array in standard Si-based CMOS technology, Science China Information Sciences, Oct. 2012, vol. 55—Issue 10, Science China Press.

M. Volpert et al., A Wafer Level approach for led packaging using TSV last technology, 2015 IEEE 65th Electronic Components and Technology Conference (ECTC), May 2015, IEEE, San Diego, CA, USA.

Renjie Wang et al., Color-tunable, phosphor-free InGaN nanowire light-emitting diode arrays monolithically integrated on silicon, Optic Express, Nov. 5, 2014, vol. 22—Issue S7, Optical Society of America, USA.

\* cited by examiner

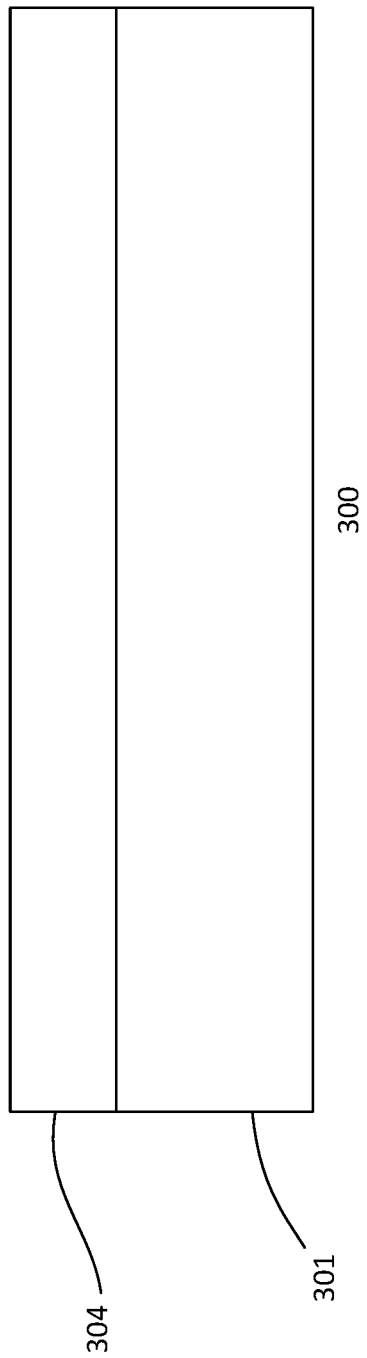

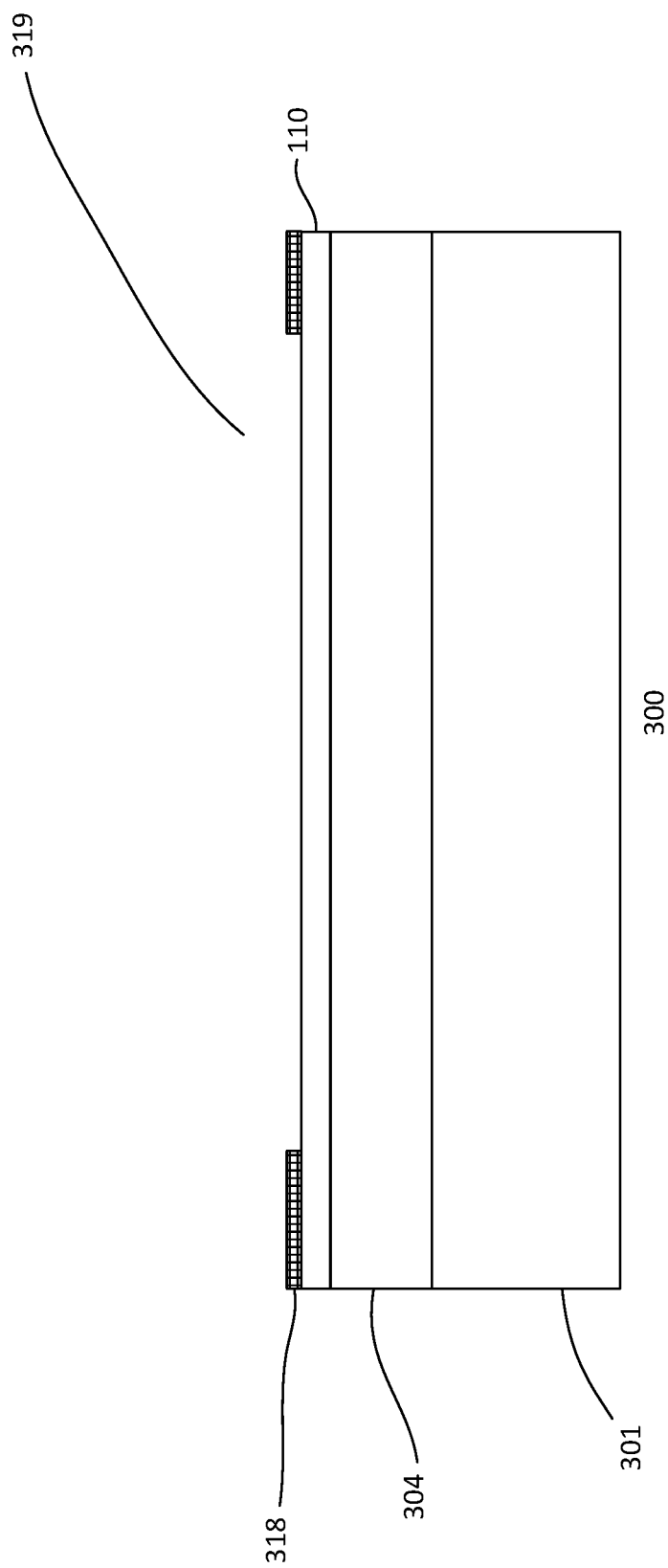

LEDS WITH THREE COLOR RGB PIXELS FOR DISPLAYS

CROSS-REFERENCE TO RELATED APPLICATIONS

This application is a continuation application which claims the benefit of co-pending U.S. patent application Ser. No. 15/599,458, filed on May 18, 2017, which claims the priority of U.S. Provisional Application No. 62/337,901, entitled "Three-Color RGB pixel using m-plane nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/355,895, entitled "3 Color RGB pixel using fin LEDs for smart displays" filed on Jun. 29, 2016. In addition, this application is concurrently filed with and cross-references to United States patent application titled "LIGHT EMITTING DIODES (LEDs) WITH STACKED MULTI-COLOR PIXELS FOR DISPLAYS" Ser. No. 15/599,427 which claims the priority of U.S. Provisional Application No. 62/337,900, entitled "3 Color stacked RGB pixel using Fin and Nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/337,902, entitled "Vertically stacked RGB LED pixel for smart display" filed on May 18, 2016; and further filed with and cross-references to United States patent application titled "LIGHT EMITTING DIODES (LEDs) WITH INTEGRATED CMOS CIRCUITS" Ser. No. 15/599,438 which claims the priority of U.S. Provisional Application No. 62/337,904, entitled "Integration of semiconductor LED with Si integrated circuits and TFTs" filed on May 18, 2016 and United States patent application titled "INTEGRATED SMART DISPLAY SYSTEM WITH MULTI-COLOR LIGHT EMITTING DIODES (LEDs)" Ser. No. 15/599,465 which claims the priority of U.S. Provisional Application No. 62/337,898, entitled "Smart display system and method of forming there of" filed on May 18, 2016. All disclosures are incorporated herewith by reference in their entireties for all purposes.

BACKGROUND

Light emitting diodes (LEDs) are widely used for various color display technologies, including televisions, smart phones and computer monitors. For portable applications, there is a need or demand for low cost, low power, high brightness and high resolution display pixel technology. Such requirement is particularly apparent for portable and small form factor displays, such as smart phones and head mount display devices which are used in virtual reality (VR) and augmented reality (AR) applications. The LEDs may also be used in other applications.

To form color displays, 3 primary colors are needed. The three primary colors are red, green and blue. However, conventional color displays using red, green and blue LEDs are complex, leading to high manufacturing cost. For example, conventional color displays employ different materials or components for different color LEDs, including color phosphors, color filters and down convertors. Furthermore, the complexity of conventional color displays is not conducive to high resolution, particular with small form factor displays.

The present disclosure is directed to cost-effective and high-resolution color LED displays.

SUMMARY

A device is disclosed. In one embodiment, the device includes a substrate, a light emitting diode (LED) body disposed on the substrate, and a multiple quantum well (MQW) disposed on the LED body. The device further includes a top LED layer disposed on the MQW, such that the LED body, the MQW and the top LED layer form an LED.

In another embodiment, a method of forming a device is presented. The method includes providing a substrate, forming an LED body on the substrate and an MQW on the LED body. The method further includes forming a top LED layer on the MQW, such that the LED body, the MQW and the top LED layer form an LED.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3a-3l show cross-sectional views of a process for forming a device; and

DETAILED DESCRIPTION

Embodiments generally relate to semiconductor devices. More particularly, embodiments relate to semiconductor devices having light emitting diodes (LEDs) with three-color pixels. In one embodiment, the three-color LEDs are disposed on the same substrate or wafer. The LEDs may be used in high brightness and high-resolution color displays, including wearable devices and head mount display devices, such as those employed in virtual reality (VR) or augmented reality (AR) applications. The LEDs may also be used in other applications.

Figure 1A:
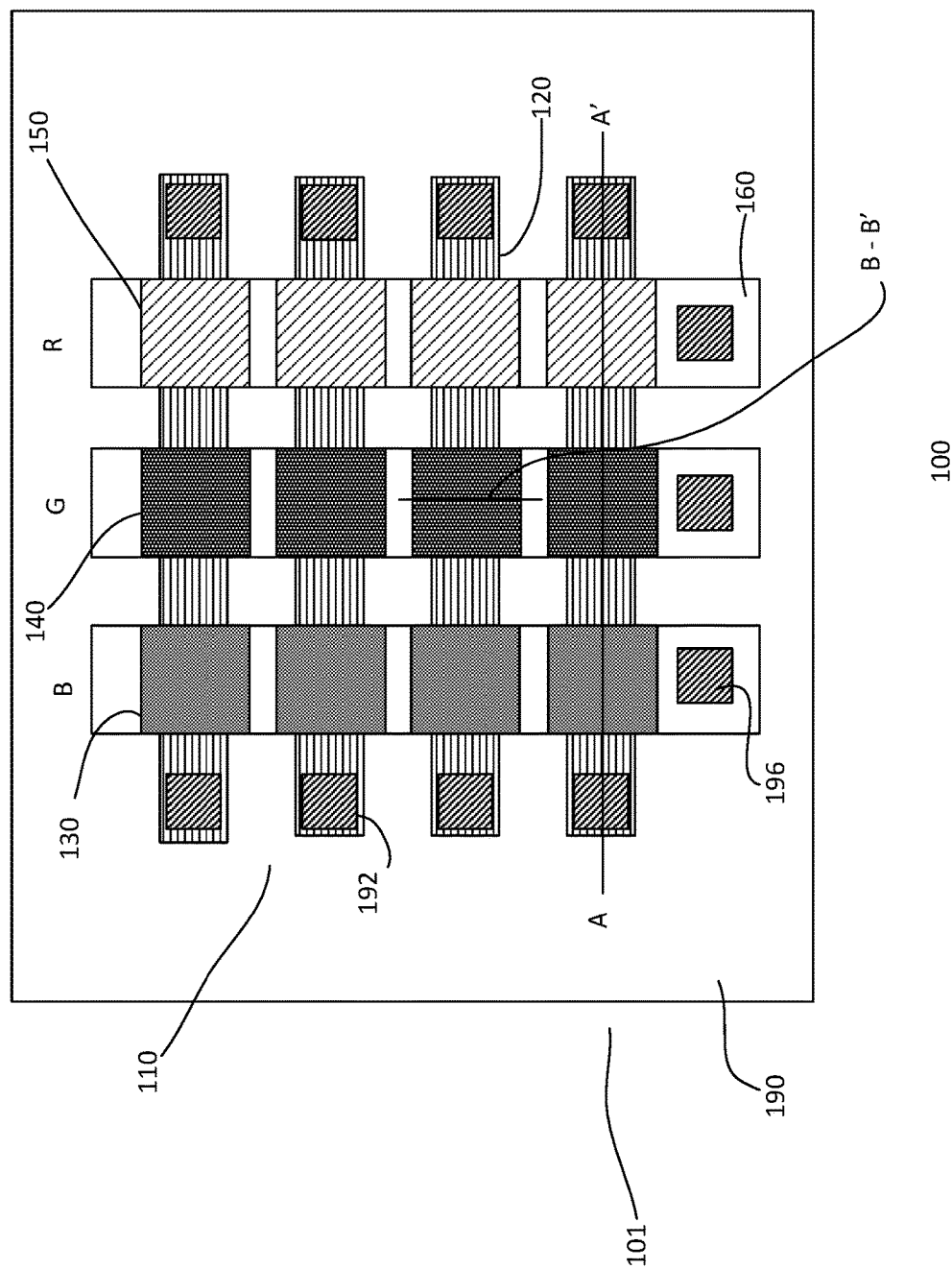
FIGS. 1a-1c show various views of an embodiment of a device.
Figure 1B:
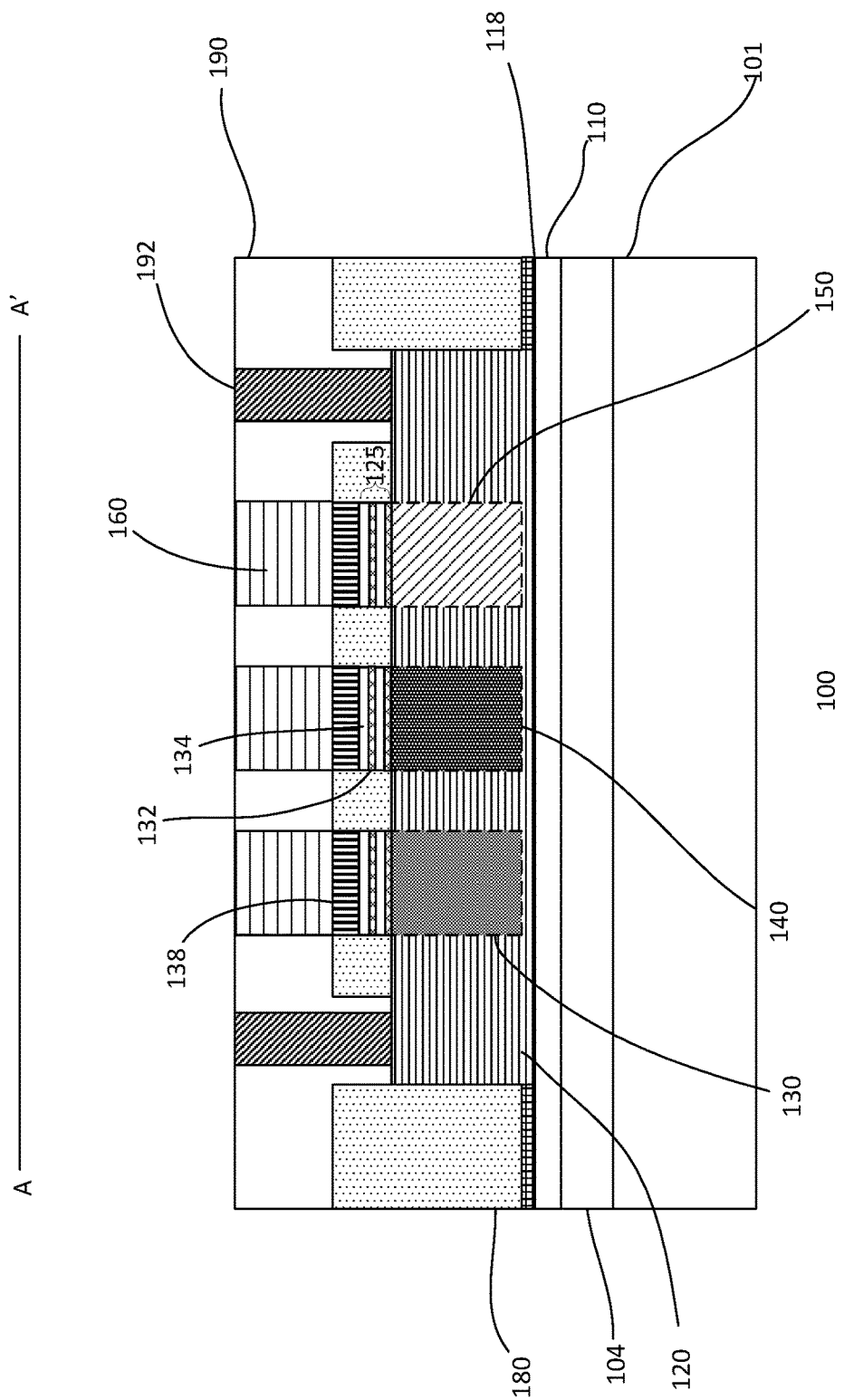
Figure 1C:
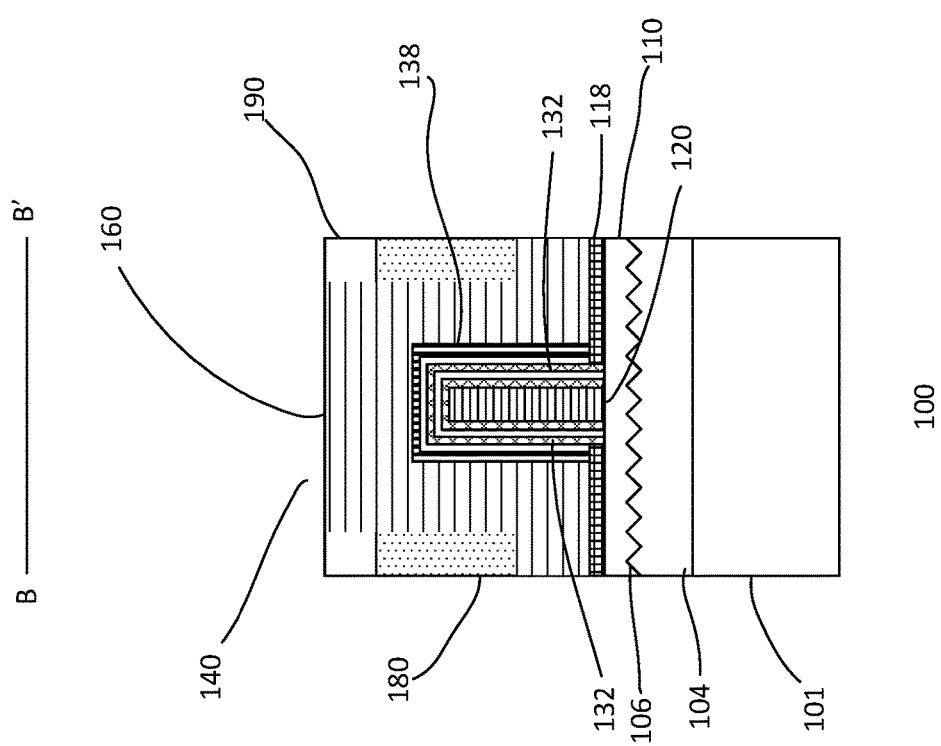

FIGS. 1a-1c show various views of an embodiment of a device 100. FIG. 1a shows a top view of the device and FIGS. 1b-1c show corresponding cross-sectional views of the device along A-A' and B-B'. Referring to FIGS. 1a-1c, the device includes a substrate 101. The substrate may be a bulk semiconductor substrate, such as a silicon (Si) substrate. In other embodiments, the substrate may be a silicon carbide (SiC) or a sapphire substrate. The substrate may alternatively be a crystal-on-insulator (COI) substrate, such as a silicon-on-insulator (SOI) substrate.

In the case of a silicon substrate, it may be a (111) oriented substrate. A Si(111) oriented substrate has a top or surface plane with a (111) crystal orientation. In alternative embodiments, the silicon substrate may be a (100) oriented substrate. A Si(100) oriented substrate has a top or surface plane with a (100) crystal orientation. In the case of a (100) substrate, the LED region of the substrate may be processed to form V-grooves on the surface to expose the (111) crystal orientation. In other words, the Si(100) substrate is processed to transform it to be a Si(111) substrate.

In one embodiment, the substrate includes a doped device well 104. The doped well, for example, extends from the surface of the substrate to a depth of about 0.5 Other depths may also be useful. The doped device well may be heavily doped with first polarity type dopants. In one embodiment, the doped device well is a heavily doped n-type ($n^+$) device well. Providing p+ doped device well may also be useful. The dopant concentration of the heavily doped device well may be $\geq$1E20 atoms/cm$^3$. Other dopant concentrations for the heavily doped device well may also be useful. The dopant concentration may depend on, for example, the technology node. In one embodiment, the doped well is provided for a silicon substrate. Providing the doped well for other substrates may also be useful. In some cases, a doped well may not be needed.

A base layer 110 may be disposed on the substrate surface. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The nucleation layer facilitates in forming the buffer layer on the substrate. In one embodiment, the nucleation layer facilitates growing a buffer layer with a wurtzite crystal structure.

The buffer layer may be a gallium nitride (GaN) layer and the nucleation layer may be an aluminum nitride (AlN) layer. Other types of nucleation layers which facilitate growing a buffer layer with a wurtzite crystal structure may also be useful. For example, metallic materials having a wurtzite crystal structure may be used. Other types of nucleation layers may also be useful. The thickness of the buffer layer may be about 50-200 nm while the nucleation layer may be about 0.5-2 μm. Other thicknesses for the buffer and nucleation layers may also be useful. In the case of grooves on the top surface of the substrate, the base layer may be planarized to form a planar surface. This results in the second base layer having a planar top surface. Alternatively, the second base layer is planarized to form a planar top surface.

The substrate, as shown, includes a pixel region containing a multi-color LED pixel. For example, the pixel region contains a three-color LED pixel. The three colors of the LED pixel are red (R), green (G) and blue (B). For example, the pixel is a RGB pixel. In one embodiment, the LED pixel includes fin-type LEDs. A fin-type LED includes a fin body 120 which serves as a body of an LED. The fin body is an elongated member disposed along a first direction of the substrate or semiconductor wafer 101. The first direction, for example, may be referred to as a row direction. For example, a fin body is disposed along the row direction. In the case of (100) silicon substrate with grooves, the fin bodies are disposed in the direction of the V-grooves. For example, the V-grooves 106 and fin bodies are disposed along the row direction. A fin body may have a height of about 1 μm, a width of about 200 nm and a length of about 5 μm. In some embodiments, the width of the fin body may be different for different portions of the fin. Other dimensions for the fin body may also be useful.

Disposed on the fin body is a R LED 150, a G LED 140 and a B LED 130. The G LED is disposed on the fin body between the R LED and the B LED. The fin body serves as a common body for the R LED, the G LED and the B LED. An LED may have length of about 1 μm along the fin body. The LEDs are separated from each other. For example, the separation distance between LEDs may be about 0.5 μm. Other lengths and separation distances for the LEDs may also be useful. A fin body with RGB LEDs forms an LED unit. For example, an LED unit forms a row of the RGB LED pixel. As shown, each row includes one set of RGB LEDs. Providing other number of sets of RGB LEDs for each row or unit may also be useful.

The pixel may include a plurality of fin bodies with R, G and B LEDs 150, 140 and 130. This, for example, forms an LED pixel with a plurality of rows of LEDs. As shown, the LED pixel includes four fin bodies with R, G and B LEDs. The same color LEDs of the fin bodies are aligned in a second or column direction. The same color LEDs of the fin bodies are electrically coupled in the column direction. For example, R LEDs are electrically coupled in the column direction, the G LEDs are electrically coupled in the column direction and the B LEDs are electrically coupled in the column direction. This forms R LED modules, G LED modules and B LED modules. In one embodiment, the LEDs of the same color of the different rows are coupled in the column direction by a transparent conductive oxide (TCO) 160, such as indium-tin-oxide (ITO). The thickness of the TCO may be about 150 nm. Other types of transparent conductive oxides, transparent conductive materials, such as graphene, or thicknesses may also be useful.

The fins and LEDs may be isolated from each other by a pixel isolation dielectric layer 180. In one embodiment, the pixel isolation layer may be a silicon nitride (SiN) layer. Other types of dielectric layers may also be useful. The pixel isolation layer has a height which is above the fin bodies. In one embodiment, the pixel isolation layer has a height which is equal to a top of the LEDs.

A fin body is a gallium nitride fin (GaN) body. In one embodiment, the fin body is an epitaxial GaN fin body. In one embodiment, a fin body is a first polarity type doped GaN fin body. For example, in the case where the device well is n-doped, the fin body is a n-doped GaN (n-GaN) fin body. The fin body may be a medium doped fin body. The dopant concentration of the fin body, for example, may be about 1E18 atoms/cm$^3$. Other dopant concentrations for the fin body may also be useful. Doping the fin body may be achieved by in-situ doping during epitaxial growth or ion implantation after formation.

In one embodiment, the buffer layer facilitates forming the fin bodies by epitaxy. The buffer layer, for example, reduces defects and provides a low defect template for the fin bodies to grow. A dielectric mask layer 118 is disposed on the substrate over the base layer to facilitate selective epitaxial growth (SEG) of the fin bodies on the substrate. For example, the mask layer includes an opening to expose the base layer for SEG of the fin body. The fin bodies may also be grown by MOCVD or MBE. In one embodiment, the dielectric mask layer is a SiN layer. A pad oxide layer may be provided between the substrate and mask layer. Other types of dielectric mask layers may also be useful.

In one embodiment, the device well commonly couples the fin bodies of the pixel. For example, the well may serve as a common terminal, such as a common terminal for the LEDs of the LED region. For example, the well serves as a common cathode terminal of the LEDs in the LED region. In addition, the well facilitates current spreading.

An LED includes a multiple quantum well (MQW) 125. The MQW includes y quantum wells (QWs), where y is ≥2. The MQW may include about 2-6 QWs. Other number of QWs may also be useful. The number of QWs may depend on, for example, desired optical efficiency. A quantum well includes a well layer 132 sandwiched by barrier layers 134. The barrier layer may be served by a barrier layer from a previous or subsequent QW or by the LED body or by a top LED layer 138.

In one embodiment, the well layer of a QW includes an indium gallium nitride (InGaN) layer and a barrier layer includes a GaN layer. The layers of the MQW may be formed by SEG. Other techniques, such as molecular beam epitaxy and metal oxide chemical vapor deposition (MOCVD) may also be used to form the MQW layers. The GaN barrier layer may be an undoped layer or a layer doped with first or second polarity type dopants. The thickness of the well layer may be about 3 nm while the thickness of the barrier layer is about 12 nm. Other thicknesses may also be useful. For example, in the case where the barrier layer is served by the body, the thickness of the barrier layer may be thicker. Other configurations of the well and barrier layers may also be useful.

In one embodiment, a MQW includes two QWs. For the first quantum well, the fin body serves as the first barrier layer and the second barrier layer over the first well layer also serves as the first barrier layer of the second QW. In such case, the first barrier layer is a doped barrier layer while the second barrier layer may be an undoped barrier layer. Providing a doped second barrier layer may also be useful. A second well layer is disposed over the second barrier layer. A third barrier layer is disposed over the second well layer. In such case, the second and third barrier layers may be undoped barrier layers. Providing doped second and third barrier layers may also be useful. Other configurations of the barrier and well layers may also be useful.

As discussed, an LED includes a top LED layer 138 disposed over the MQW. In one embodiment, an electron blocking layer (not shown) is disposed between the top LED layer and the MQW layer. For example, a top LED layer is disposed on the electron blocking layer (EBL) which is disposed on top of the MQW. The EBL may be an undoped layer. The EBL, for example, may be an undoped GaN or AlGaN layer. Other types of EBLs may also be useful. The top LED layer, in one embodiment, is a second polarity doped GaN top LED layer. For example, in the case of a n-GaN fin, the top LED layer is a p-GaN layer. The dopant concentration of the top LED layer may be ≥1E19 atoms/cm$^3$. Other dopant concentrations for the top LED layer may also be useful. The top LED layer may be epitaxially grown. Doping the top LED layer may be achieved by in-situ doping during epitaxial growth or ion implantation after formation. The top of an LED is the top surface of the top LED layer over a fin body.

The pixel includes R, G and B LEDs. The different color LEDs have different bandgaps. In one embodiment, the different bandgaps for different color LEDs are achieved by varying the percentage of In in the well layers of the MQW. In one embodiment, the percentage of In of the InGaN layer of the well layers of the MQW is varied to achieve different bandgaps for different color LEDs. For example, x defines the percentage (atomic percentage) of In in the $In_xGa_{1-x}N$ well layer. In one embodiment, the percentage of In for the $In_xGa_{1-x}N$ layer in the MQW may be as follows:

Blue: x=15-20%;
Green: x=25-30%; and
Red: x=35-40%.

Other percentages of In may be useful, as long as the different bandgaps have sufficient separation.

The body or fin portions for the different color LEDs may be configured to have different widths. The term body may also refer to a fin portion. The different widths facilitate having different percentages of In in the well layers of the MQW. The well layers with higher In percentage is facilitated with a narrower body. In one embodiment, the width of the body for the R LED is less than about 100 nm, the width of the body for the G LED may be about 200 nm while the width of the body of the B LED is greater than about 300 nm. In other embodiments, the width of the body for the R LED is about 25-125 nm, the width of the body for the G LED is about 150-250 nm while the width of the body of the B LED is greater than about 300-400 nm. Other widths for different bodies may also be useful.

As discussed, TCO layers 160, such as ITO, are disposed over the LEDs and serves to couple the same color LEDs in the second or column direction. Separating the TCO layers is an interconnect dielectric layer 190. The interconnect dielectric layer may be a silicon oxide layer. The oxide layer covers the pixel region over the pixel. The interconnect dielectric layer may be processed to have a planar top surface. The planar top surface of the interconnect dielectric may be coplanar, for example, with the top of the TCO layer. Contact regions may be provided for the TCO layers on a side of the pixel away from the LEDs. The contact regions, for example, may be disposed on a side of the pixel in the column direction. Other configurations of contact regions may also be useful.

Contacts may be disposed in the interconnect dielectric layer. For example, contacts 192 may be disposed in the interconnect dielectric layer which are coupled to the fin bodies and contacts 196 may be disposed in the interconnect dielectric layer which are coupled to the TCO layers. The contacts to the fin bodies serve as negative or cathode terminals and the contacts to the TCO layers serve as positive or anode terminals of the LED pixel. The cathode terminal may be a common terminal for the LEDs. The contacts, for example, may be aluminum (Al) or tungsten (W) contacts. Other types of conductive metals may also be useful.

The device may include additional back-end-of-line layers. For example, additional interlevel dielectric (ILD) layers may be included. An ILD layer includes a contact level with via contacts and metal level with metal lines. An ILD layer may be formed using various processes. For example, single damascene, dual damascene, and/or reactive ion etch techniques may be employed. Other techniques may also be employed to form the ILD layers. The contacts may be W or copper contacts while the metal lines may be copper lines. Other types of contacts and metal lines may also be useful. The ILD layers may provide interconnect routings for the device without obscuring the LEDs. A passivation layer may be disposed over the top of the ILD layers.

Figure 2A:
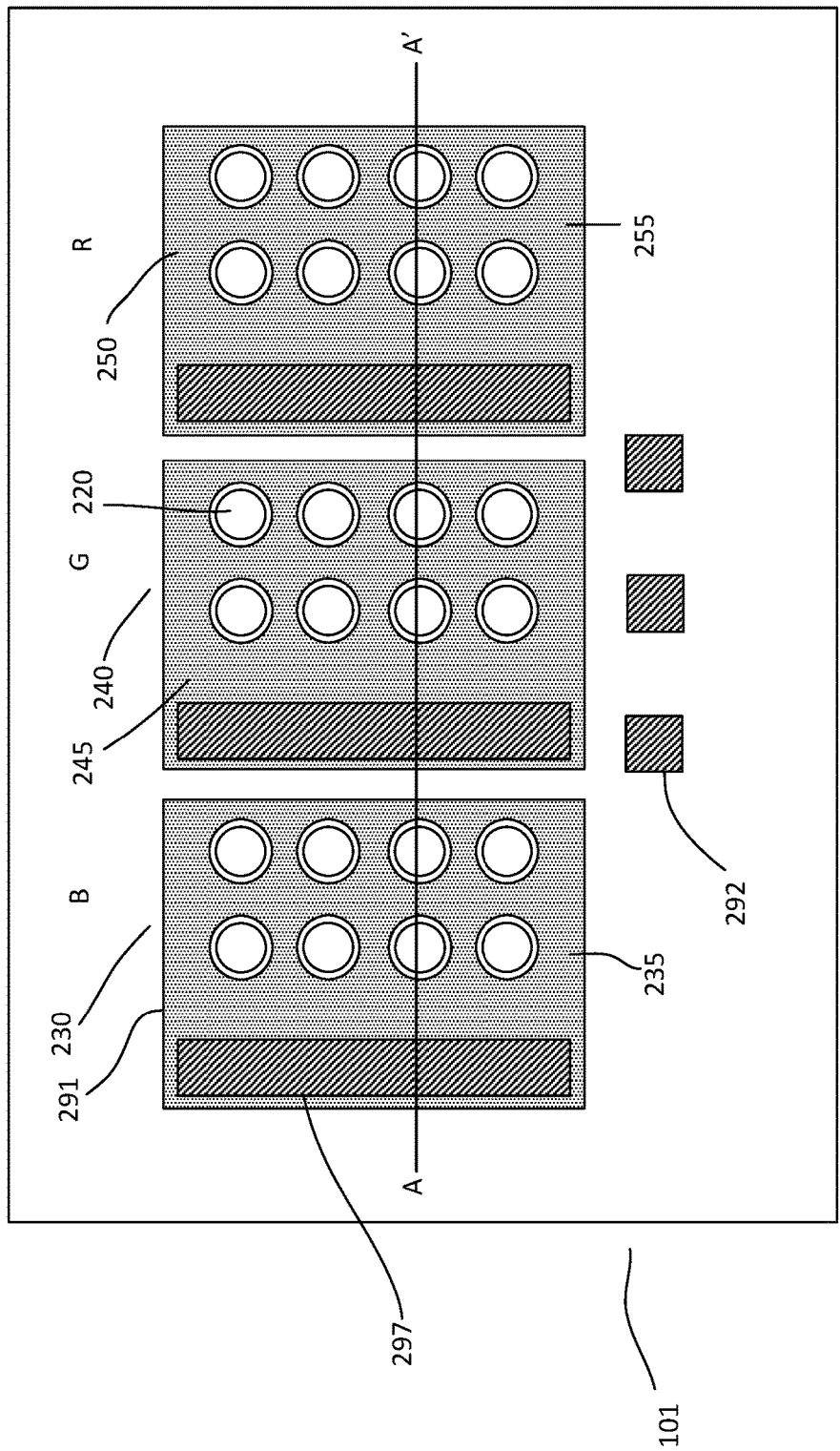
FIGS. 2a-2b show various views of another embodiment of a device.
Figure 2B:
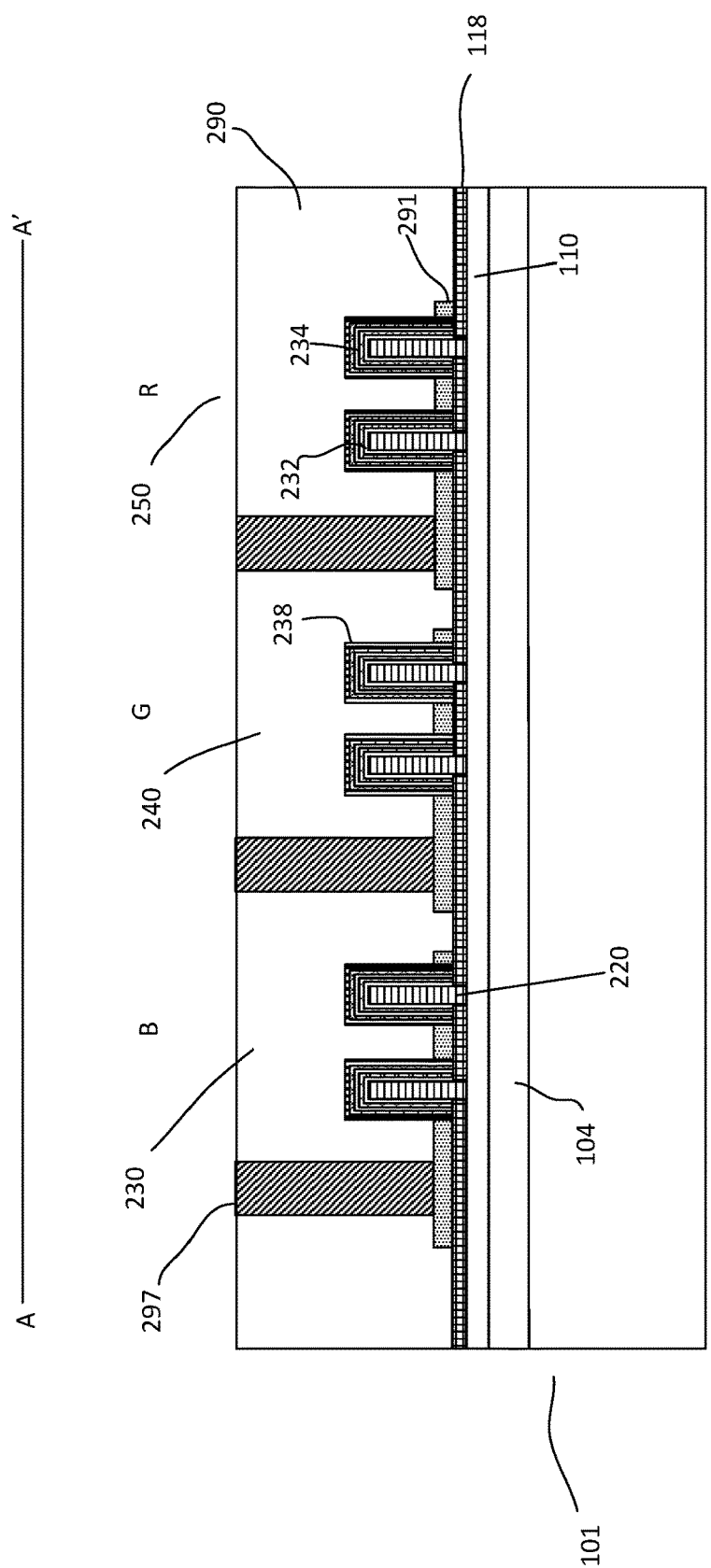

FIGS. 2a-2b show various views of another embodiment of a device 200. FIG. 2a shows a top view of the device and FIG. 2b shows a corresponding cross-sectional view of the device along A-A'. The device is similar to the device of FIGS. 1a-1c. Common elements may not be described or described in detail.

Referring to FIGS. 2a-2b, the device includes a substrate 101. The substrate may be a be a Si(111). Alternatively, the substrate may be a (100) oriented substrate. In the case of a Si(100) substrate, it is processed to form V-grooves on the surface to expose the (111) crystal orientation. In other embodiments, the substrate may be a SiC or sapphire substrate.

A first polarity type heavily doped device well 104 is provided in the substrate. A base layer 110 may be disposed on the substrate surface. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The buffer layer may be a gallium nitride (GaN) layer and the nucleation layer may be an aluminum nitride (AlN) layer.

The substrate, as shown, includes a pixel region containing a three-color LED pixel. The three colors are R, G and B. For example, the pixel is a RGB LED pixel. The LED pixel includes nanowire-type LEDs. A nanowire-type LED includes a nanowire body 220. The nanowire body may be an elongated member having a circular cross-sectional shape disposed on the substrate. Providing other cross-sectional shaped nanowire bodies may also be useful. The nanowire body may have a height of about 1 μm and a diameter of about 200 nm. Other nanowire body dimensions may also be useful. In one embodiment, different color LEDs have bodies with different diameters. The nanowire body extends from the substrate in a direction perpendicular to its surface. In one embodiment, sides of the nanowire body extending from the substrate surface are along a m-plane while the top of the body is along a c-plane. An LED is disposed on the nanowire body. In one embodiment, the LED surrounds the nanowire body.

In one embodiment, the pixel includes a R LED module 255, a G LED module 245 and a B LED module 235. In one embodiment, an LED module includes one or more nanowire-type LEDs. The R LED module includes R LEDs 250, the G LED module includes G LEDs 240 and the B LED module includes B LEDs 230. As shown, an LED module includes a 4×2 matrix of nanowire LEDs. For example, an LED module includes 4 rows and 2 columns of nanowire-type LEDs. An LED module may include other numbers of rows and columns of LEDs, including a 1×1 matrix. In one embodiment, the LED modules each includes the same number and configuration of LEDs. A row of LEDs from the different LED modules form an LED unit. For example, a row of R LEDs forms a R LED unit, a row of G LEDs forms a G LED unit and a row of B LEDs for a B LED unit.

A nanowire body may be a gallium nitride (GaN) body. In one embodiment, a nanowire body is an epitaxial GaN nanowire body. In one embodiment, a nanowire body is a first polarity type doped GaN body. For example, the nanowire body may be a n-GaN body. The nanowire body may be a medium doped body. The dopant concentration of the nanowire body may be about 1E18 atoms/cm$^3$. Other dopant concentrations for the nanowire body may also be useful. Doping the nanowire body may be achieved by in-situ doping during epitaxial growth or ion implantation after formation.

In one embodiment, the buffer layer facilitates forming the nanowire bodies by epitaxy. A dielectric mask layer 118 is disposed on the substrate over the base layer to facilitate selective epitaxial growth (SEG) of the nanowire bodies on the substrate. For example, the mask layer includes openings to expose the base layer for SEG of the nanowire bodies. In one embodiment, the dielectric mask layer is a SiN layer. A pad oxide layer may be disposed under the SiN mask layer. Other types of dielectric mask layers may also be useful.

An LED includes a multiple quantum well (MQW) 225. The MQW surrounds the nanowire body. The MQW includes y quantum wells (QWs), where y is ≥2. The MQW may include about 2-6 QWs. Other numbers of QWs may also be useful. The number of QWs may depend on, for example, obtaining high optical efficiency. A quantum well includes a well layer 232 sandwiched by barrier layers 234. The barrier layer may be served by a barrier layer from a previous or subsequent QW or by the LED body or by a top LED layer 238.

In one embodiment, the well layer of a QW includes InGaN layer and a barrier layer includes a GaN layer. The layers of the MQW may be formed by SEG. The layers may also be formed by MOCVD or MBE. The GaN barrier layer may be an undoped layer or a layer doped with first or second polarity type dopants.

In one embodiment, a MQW includes two QWs. For the first quantum well, the fin body serves as the first barrier layer and the second barrier layer over the first well layer also serves as the first barrier layer of the second QW. In such case, the first barrier layer is a doped barrier layer while the second barrier layer may be an undoped barrier layer. Providing a doped second barrier layer may also be useful. A second well layer is disposed over the second barrier layer. A third barrier layer is disposed over the second well layer. In such case, the second and third barrier layers may be undoped barrier layers. Providing doped second and third barrier layers may also be useful. Other configurations of the barrier and well layers may also be useful.

As discussed, a nanowire LED may include a top LED layer 238 disposed on the MQW. An EBL (not shown) is disposed between the top LED layer and the MQW. For example, a top LED layer is disposed on the EBL which is disposed on top of the MQW. The EBL may be an undoped layer. The EBL, for example, may be an undoped GaN or AlGaN layer. Other types of EBLs may also be useful. The top LED layer may be an epitaxial top LED layer. The top LED layer, in one embodiment, is a second polarity doped GaN top LED layer. For example, in the case of a n-GaN nanowire base, the top LED layer is a p-doped GaN layer. The dopant concentration of the top LED layer may be ≥1E19 atoms/cm$^3$. Other dopant concentrations for the top LED layer may also be useful. The thickness of the top LED layer may be about 150 nm. The top LED layer may have other thicknesses. Doping the top LED layer may be achieved by in-situ doping during epitaxial growth or ion implantation after formation.

As discussed, the pixel includes R, G and B LEDs. The different color LEDs have different bandgaps. In one embodiment, the different bandgaps for different color LEDs are achieved by varying the percentage of In in the well layers of the MQW. In one embodiment, the percentage (atomic percentage) of In of the InGaN layer of the well layers of the MQW is varied to achieve different bandgaps for different color LED units. For example, x defines the percentage of In in the $In_xGa_{1-x}N$ well layer. In one embodiment, the percentage of In for the $In_xGa_{1-x}N$ layer in the MQW may be as follows:

Blue: x=15-20%;
Green: x=25-30%; and
Red: x=35-40%.

Other percentages of In may be useful, as long as the different bandgaps have sufficient separation.

The base for the different color LEDs may be configured to have different widths. The different widths facilitate having different percentages of In in the well layers of the MQW. The well layers with higher In percentage is facilitated with a narrower base or body. In one embodiment, the width of the base for the R LED is less than about 100 nm, the width of the base for the G LED may be about 200 nm while the width of the base of the B LED is greater than about 300 nm. In other embodiments, the width of the base for the R LED is about 25-125 nm, the width of the base for the G LED is about 150-250 nm while the width of the base of the B LED is greater than about 300-400 nm. Other widths for different bases may also be useful. In the case where different color LEDs, such as G and R LEDs, share a common base, the narrow width of the two different colors may be used to facilitate a higher indium percentage.

In one embodiment, each LED module includes a conductive plate 291 which commonly couples the LEDs of the LED module. In one embodiment, the conductive plate is a planar metal plate, such as tungsten (W) or aluminum (Al). Other types of conductive plates, such as copper or copper alloy, may also be useful. The conductive plate may also be a transparent conductive plate, such as TCO or graphene. As shown, a conductive plate is disposed on the mask layer and forms a first metal layer (M1) of the device. The thickness of the conductive plate may be about 250 nm. Other thicknesses may also be useful. The conductive plate surrounds and abuts the sides of the top LED layer at a lower portion of the LED. The conductive plate may include a contact region on one side of the LED module. For example, a contact region is disposed on a first side of the matrix of LEDs of an LED module. The contact region serves as a first terminal of the LEDs of the LED module. The first terminal, in one embodiment, is an anode terminal An interconnect dielectric layer 290 is disposed over the substrate. The interconnect dielectric layer covers the substrate. For example, the dielectric layer covers the LEDs, conductive plates and mask layer. The thickness of the dielectric layer may be about 1.5 µm. Other thickness for the dielectric layer may also be useful. The interconnect dielectric layer may be a silicon oxide layer. Other types of dielectric layers may also be useful. The interconnect dielectric layer may be processed to have a planar top surface above the LEDs.

Contacts may be disposed in the interconnect dielectric layer. Contacts may be disposed in the dielectric layer, coupling to the terminals of the LEDs. The contacts may be Al or W contacts. Other types of contacts may also be useful.

In one embodiment, first contacts 297 are disposed in the interconnect dielectric layer. The first contacts are coupled to first terminals of the LED modules. The first terminals are anode terminals. For example, a first contact is provided for each LED module. The first contact is coupled to the contact region of the conductor plate which commonly coupled the LEDs of an LED module. For example, a first contact is coupled to the conductor plate of the R LED module, a first contact is coupled to the conductor plate of the G LED module and a first contact is coupled to the conductor plate of the B LED module. The first contacts, in one embodiment, are contact bars which also serves as mirrors to facilitate reflection of light from the LEDs.

Second contacts 292 are also disposed in the interconnect dielectric layer. The second contacts are coupled to the second terminals of the LEDs. The second terminals are cathode terminals. In one embodiment, the second contacts are coupled to the device well which is coupled to the nanowire bodies of the LEDs. The second contacts, as shown, are disposed on a side of the conductive plates to access the device well. The second contacts may be via contacts. Alternatively, the second contacts may be contact bars to further facilitate reflection of light from the LEDs. The device well serves as a common second or cathode terminal of the LEDs of the LED region.

The device may include additional back-end-of-line layers. For example, additional interlevel dielectric (ILD) layers may be included. An ILD layer includes a contact level with via contacts and metal level with metal lines. An ILD layer may be formed using various processes. For example, single damascene, dual damascene, and/or reactive ion etch techniques may be employed. Other techniques may also be employed to form the ILD layers. The contacts may be W or copper contacts while the metal lines may be copper lines. Other types of contacts and metal lines may also be useful. The ILD layers may provide interconnect routings for the device without obscuring the LEDs. A passivation layer may be disposed over the top of the ILD layers.

FIGS. 3a-3l show cross-sectional views of an embodiment of a process for forming a device 300. The device, for example, is similar to that described in FIGS. 1a-1c, and FIGS. 2a-2b. Common elements may not be described or described in detail.

Referring to FIG. 3a, a substrate 301 is provided. The substrate may be a bulk semiconductor substrate, such as a silicon (Si) substrate. In one embodiment, the substrate is a Si(111) substrate. Alternatively, the substrate may be a Si(100) substrate. In other embodiments, the substrate may be a silicon carbide (SiC) or a sapphire substrate. The substrate may also be a COI substrate.

Figure 3B:
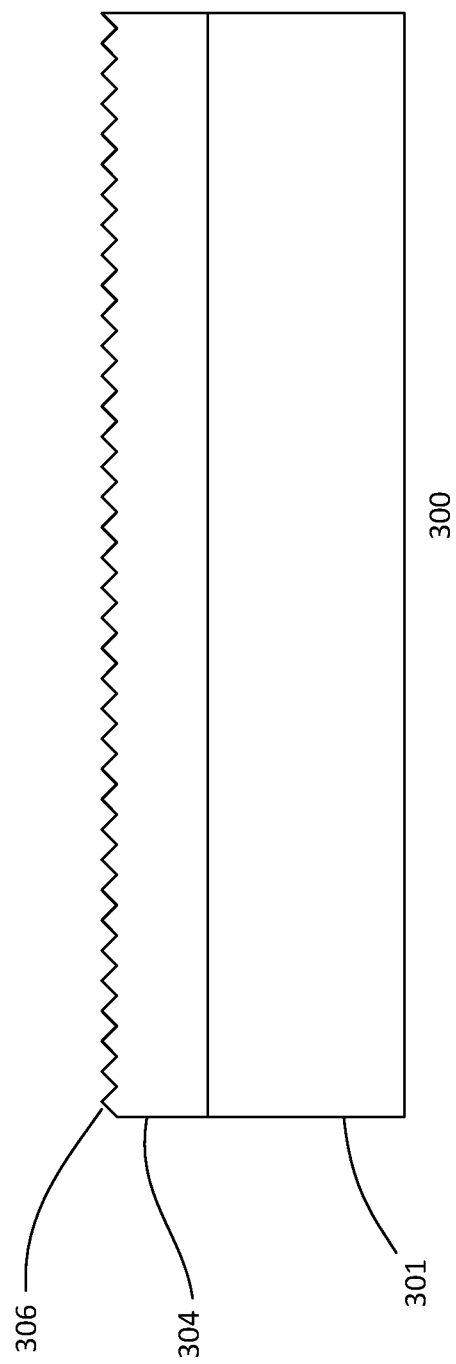

In one embodiment, as shown in FIG. 3b, the substrate is prepared with a device well 304. The device well is a doped well. The doped well, for example, extends from the surface of the substrate to a depth of about 0.5 The doped device well may be heavily doped with first polarity type dopants. In one embodiment, the doped device well is a heavily doped n-type ($n^+$) device well. The device well may be formed by implanting first polarity type dopants. An implant mask may be used to implant the first polarity type dopants. For example, the implant mask exposes the LED region in which dopants are to be implanted. An anneal is performed after forming the device wells. The anneal activates the dopants.

In the case of a Si(100) substrate, it may be processed to form V-grooves 306 to expose the (111) surface in the Si(100) substrate in the LED region. The V-grooves may be formed by an anisotropic etch, such as a wet etch. The anisotropic etch employs an alkaline etch solution, such as TMAH or KOH. Alternatively, an isotropic etch, such as a reactive ion etch (ME) may be employed. The etch may be a blanket etch without an etch mask or a selective etch using an etch mask.

Figure 3C:
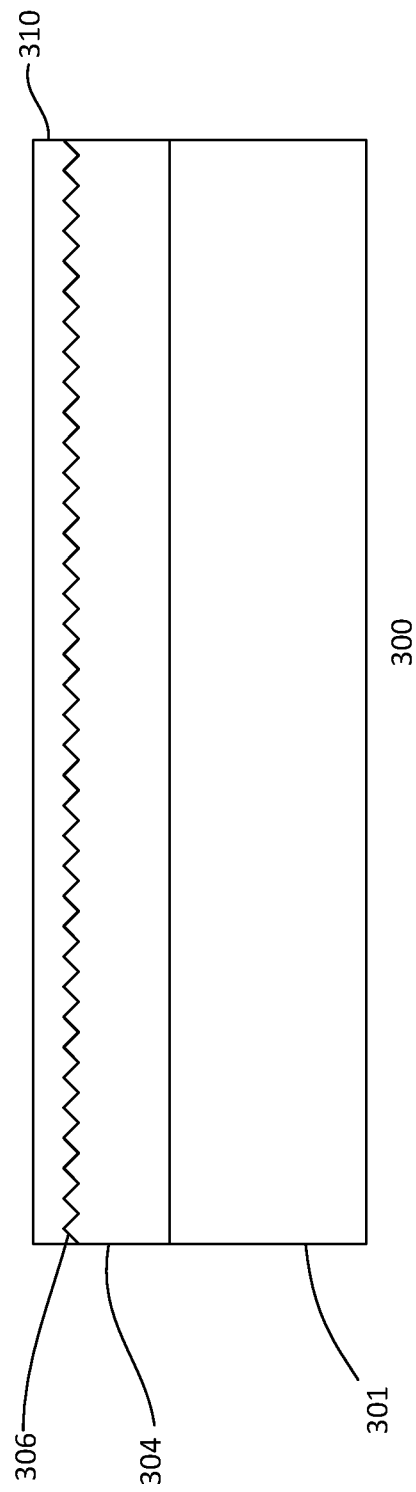

As shown in FIG. 3c, a base layer 310 is formed over the substrate. The base layer may be a composite base layer having multiple layers. In one embodiment, the base layer includes a buffer layer and a nucleation layer. The nucleation layer is disposed on the substrate and the buffer layer is disposed on the nucleation layer. The nucleation layer may be an AlN layer and the buffer layer may be a GaN layer. The layers may be formed by MOCVD or MBE growth process. Other forming or deposition techniques may also be useful. The thickness of the nucleation layer may be about 50-200 nm while the buffer layer may be about 0.5-2 Other thicknesses for the buffer and nucleation layers may also be useful. In the case of grooves on the top surface of the substrate, the base layer may be planarized to form a planar surface. For example, a chemical mechanical polish (CMP) may be performed to form a planar top surface. This results in the second base layer having a planar top surface. Alternatively, the second base layer is planarized to form a planar top surface.

In FIG. 3d, a mask layer 318 is formed on the substrate. The mask layer, in one embodiment, is a SiN layer. A pad oxide may be formed below the mask layer. The pad oxide may be formed by thermal oxidation. The mask layer may be formed by, for example, CVD. The mask layer is patterned to form an opening 319 corresponding to where a fin body is to be formed. To pattern the mask layer, mask and etch techniques may be used. For example, a soft mask, such as a photoresist mask, may be formed over the mask layer. An exposure source may selectively expose the photoresist layer through a reticle containing the desired pattern. After selectively exposing the photoresist layer, it is developed to form openings corresponding to the location where the opening 319 in the mask layer 318 is to be formed. To improve lithographic resolution, an anti-reflective coating (ARC) may be used below the photoresist layer.

The patterned photoresist layer serves as an etch mask for an etch process. For example, the etch transfers the pattern of the photoresist mask to the mask layer 318. The etch removes the mask layer unprotected by the photoresist mask, exposing the base layer below. The etch, for example, may be an anisotropic etch, such as reactive ion etch (ME). Other types of etch processes may also be useful. After patterning the mask layer, the photoresist etch mask is removed, for example, by ashing. Other techniques for removing the photoresist mask may also be useful.

Figure 3E:
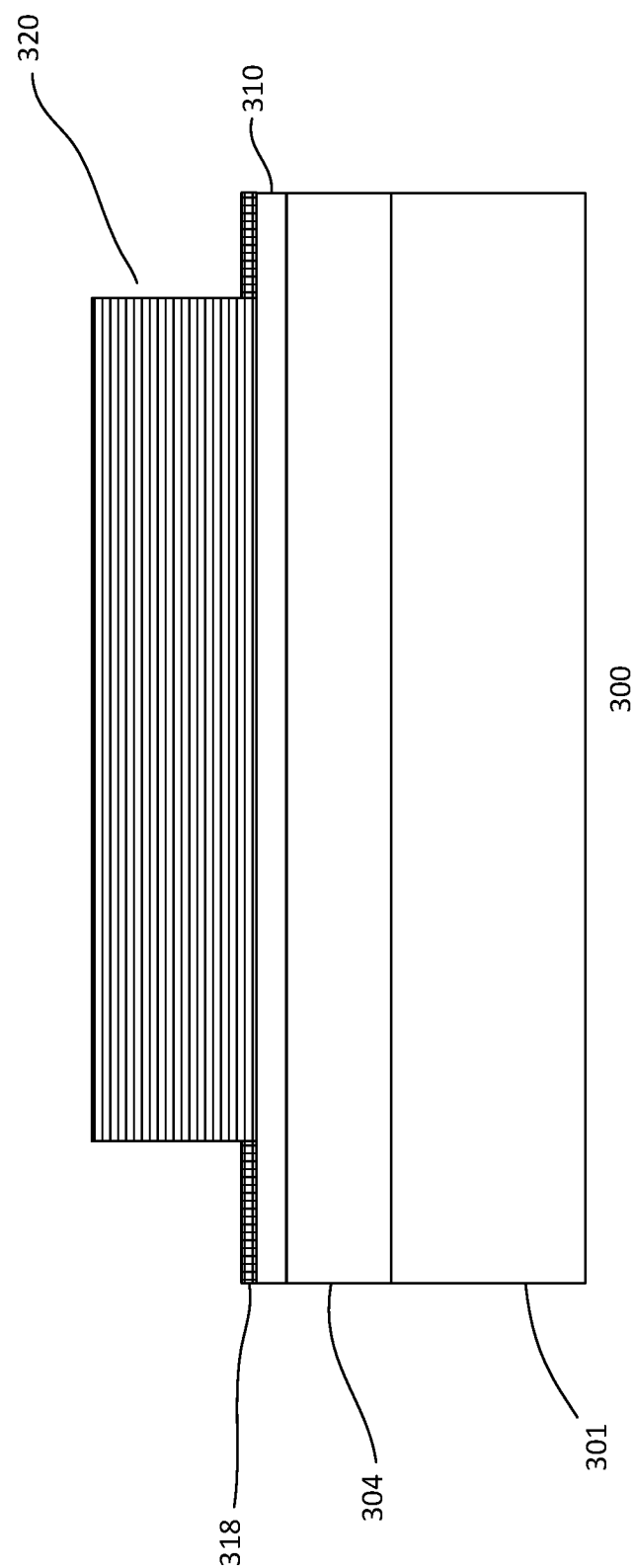

As shown in FIG. 3e, a fin body 320 is formed on the substrate. In one embodiment, the fin body is formed in the opening in the mask layer. The fin body is a GaN body formed by SEG. In one embodiment, a fin body is a first polarity type doped GaN fin body. In one embodiment, the fin body is n-GaN fin body. Doping the fin body may be achieved by in-situ doping during epitaxial growth or ion implantation after formation.

Figure 3F:
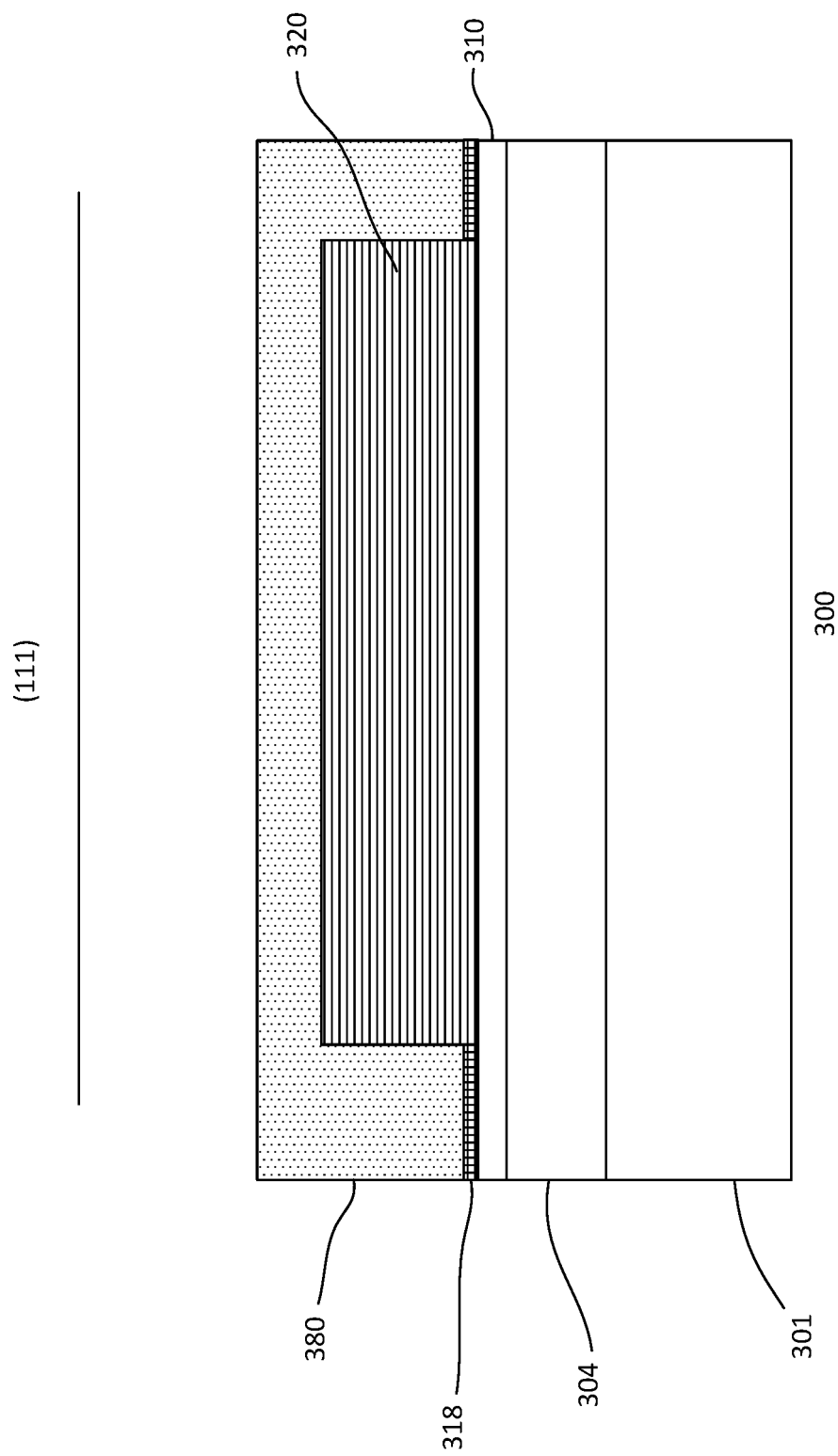

Referring to FIG. 3f, a pixel isolation dielectric layer 380 is formed on the substrate, covering the fin body. In one embodiment, the pixel isolation layer may be a SiN layer. Other types of dielectric layers may also be useful. The isolation layer may be formed by CVD. A planarizing or polishing process, such as chemical mechanical polishing (CMP), is performed to form a planar top surface for the isolation layer. The pixel isolation layer has a height which is above the fin bodies. In one embodiment, the pixel isolation layer has a final height which is equal to a top of the subsequently formed LEDs. For example, the pixel is disposed above the fin by about 500 nm, which is the thickness or height of an LED.

Figure 3G:
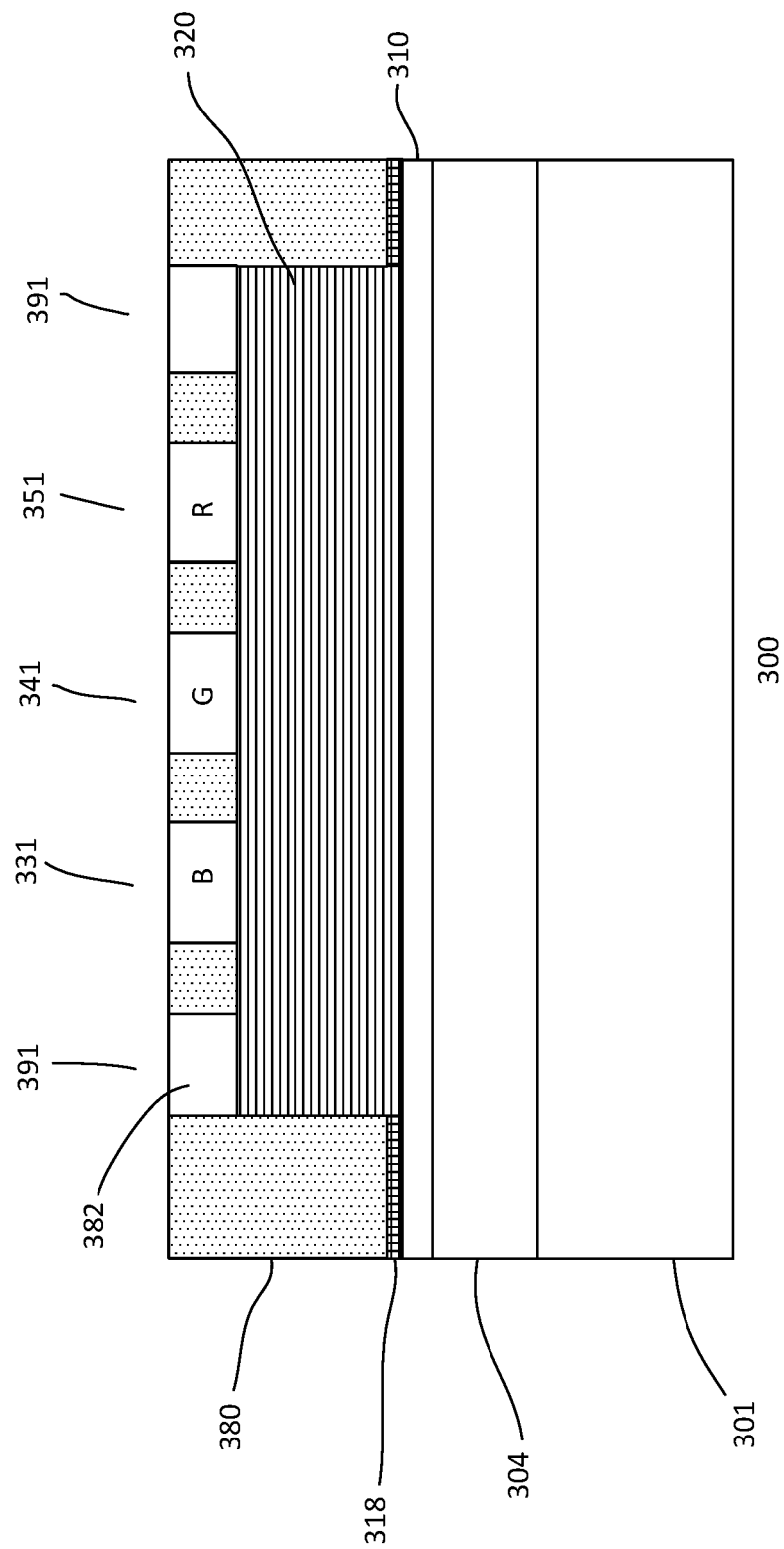

In FIG. 3g, the pixel isolation layer is patterned to expose active regions 331, 341 and 351 of the B, G and R LEDs. Patterning of the isolation layer also exposes the contact regions 391 of the fin. In addition, patterning the isolation layer exposes the areas of the pixel in which a TCO layer is disposed. In one embodiment, the patterned isolation layer exposes areas along a column direction of the pixel to provide coupling of the same color LEDs of the pixel and contact regions to the different color LEDs. Patterning of the pixel isolation layer may be achieved using mask and etch techniques.

Figure 3H:
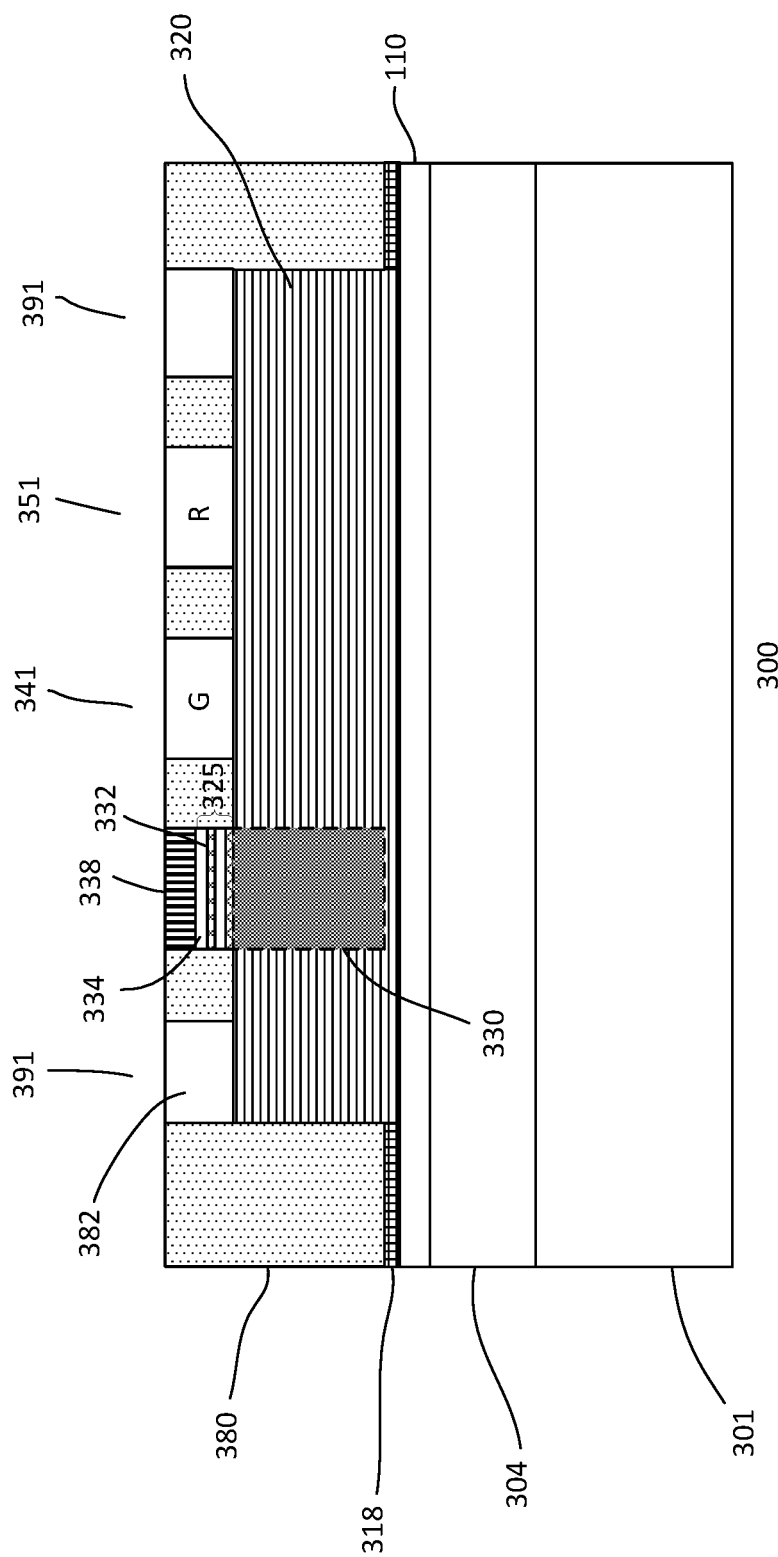

After patterning the pixel isolation layer, the photoresist mask is removed. A fill dielectric layer 382 is formed on the substrate, as shown in FIG. 3h. The fill dielectric layer fills the openings in and covers the patterned pixel isolation layer. The dielectric layer may be a silicon oxide isolation layer. The dielectric layer may be formed by CVD. A polishing process, such as chemical mechanical polishing (CMP), is performed to remove excess dielectric material, forming a coplanar top surface with the pixel isolation layer.

Figure 3I:
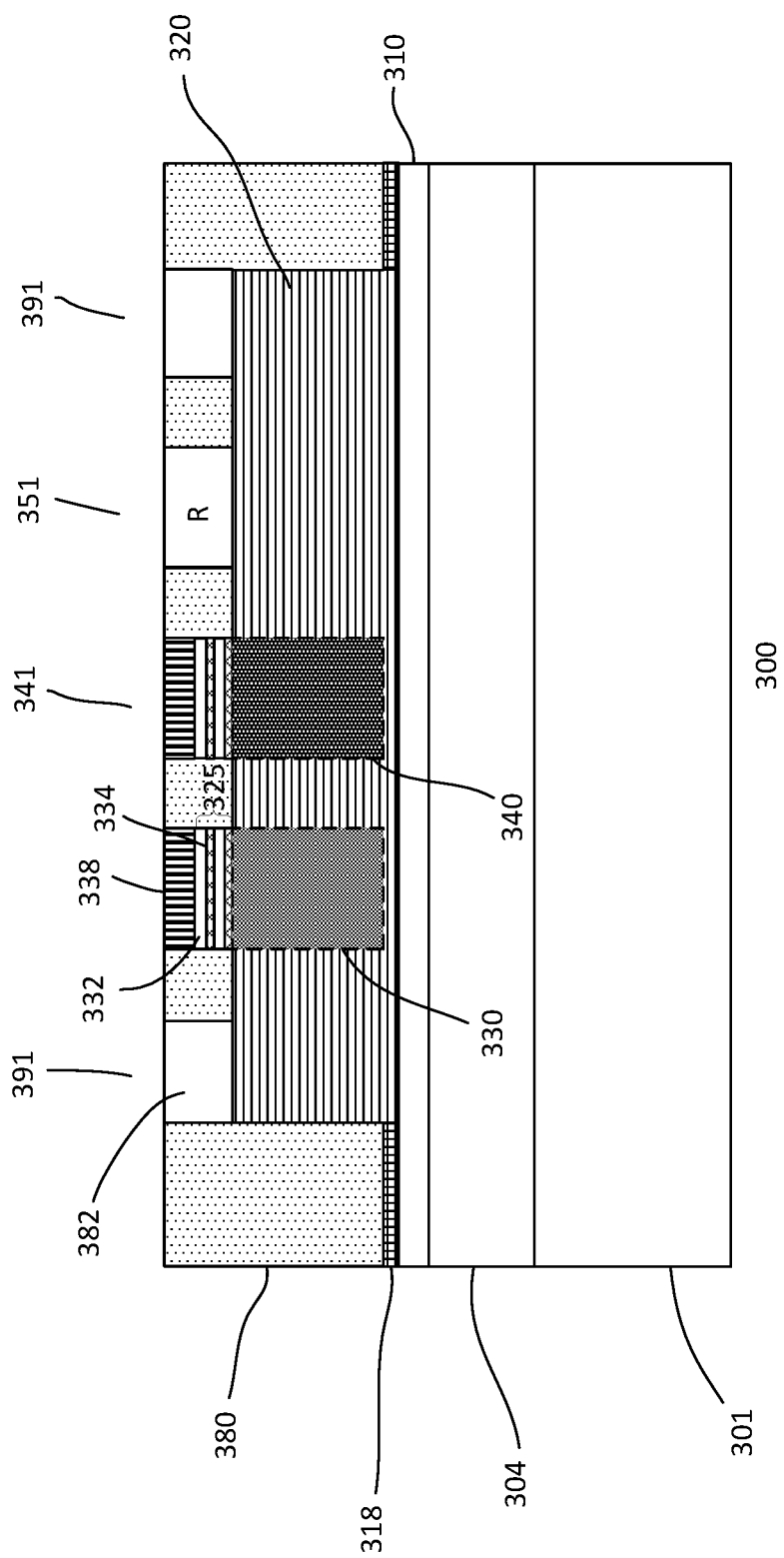

In FIG. 3i, the dielectric layer is selectively patterned to expose at least the active B region 331. The patterning exposes the B region of the fin body. In some embodiments, the patterning of the dielectric layer removes it from the B region, including the dielectric layer in the column direction which links other B regions of other fin bodies of the pixel. To pattern the dielectric layer, mask and etch techniques may be employed. The etch, for example, is selective to nitride and the fin body, enabling removal of the oxide layer to be removed without removing the oxide layer and fin body. The photoresist mask is removed after patterning.

The process proceeds to form a MQW of the B LEDs. For example, the process forms a B MQW 325 for the B LEDs 330. As previously discussed, a QW of the MQW includes a well layer sandwiched by two barrier layers. In one embodiment, the MQW includes two QWs. Forming other number of QWs for the MQW may also be useful. As shown, a first well layer 332 is formed over the exposed B LED region of the fin body. A first barrier layer 334 is formed over the first well layer. In one embodiment, the first well layer is a InGaN layer and the first barrier layer is a GaN layer. The fin body serves as a barrier layer. The fin body and the first barrier layer sandwiches the first well layer to form the first QW. A second well layer, such as InGaN and a second barrier layer, such as GaN, are formed over the first QW. The first barrier layer, the second well layer and the second barrier layer serves as the second QW. As such, the MQW includes alternating layers of InGaN 332 and GaN 334 disposed over the exposed portion of the fin body.

In one embodiment, the layers of the B MQW are formed by SEG. The layers of the MQW may also be formed by MOCVD or MBE. For example, the layers of the MQW are selectively formed on the fin body. The mask layer and pixel isolation layer prevents the formation of the MQW layers except on the fin body. In one embodiment, the first InGaN layer is selectively formed on the fin body. The GaN layer is selectively formed on the InGaN layer. For an additional MQW layer, it is formed on an underlying MQW layer. The thickness of the InGaN layer may be about 3 nm and the GaN layer may be about 12 nm. Other thicknesses may also be useful.

As discussed, the InGaN layer of a B LED has a B bandgap. In one embodiment, a percentage (atomic percentage) x of In in the $In_xGa_{1-x}N$ layer of the B MQW is about 15-20%. Providing other percentages of In in the InGaN layer may also be useful.

Figure 3J:
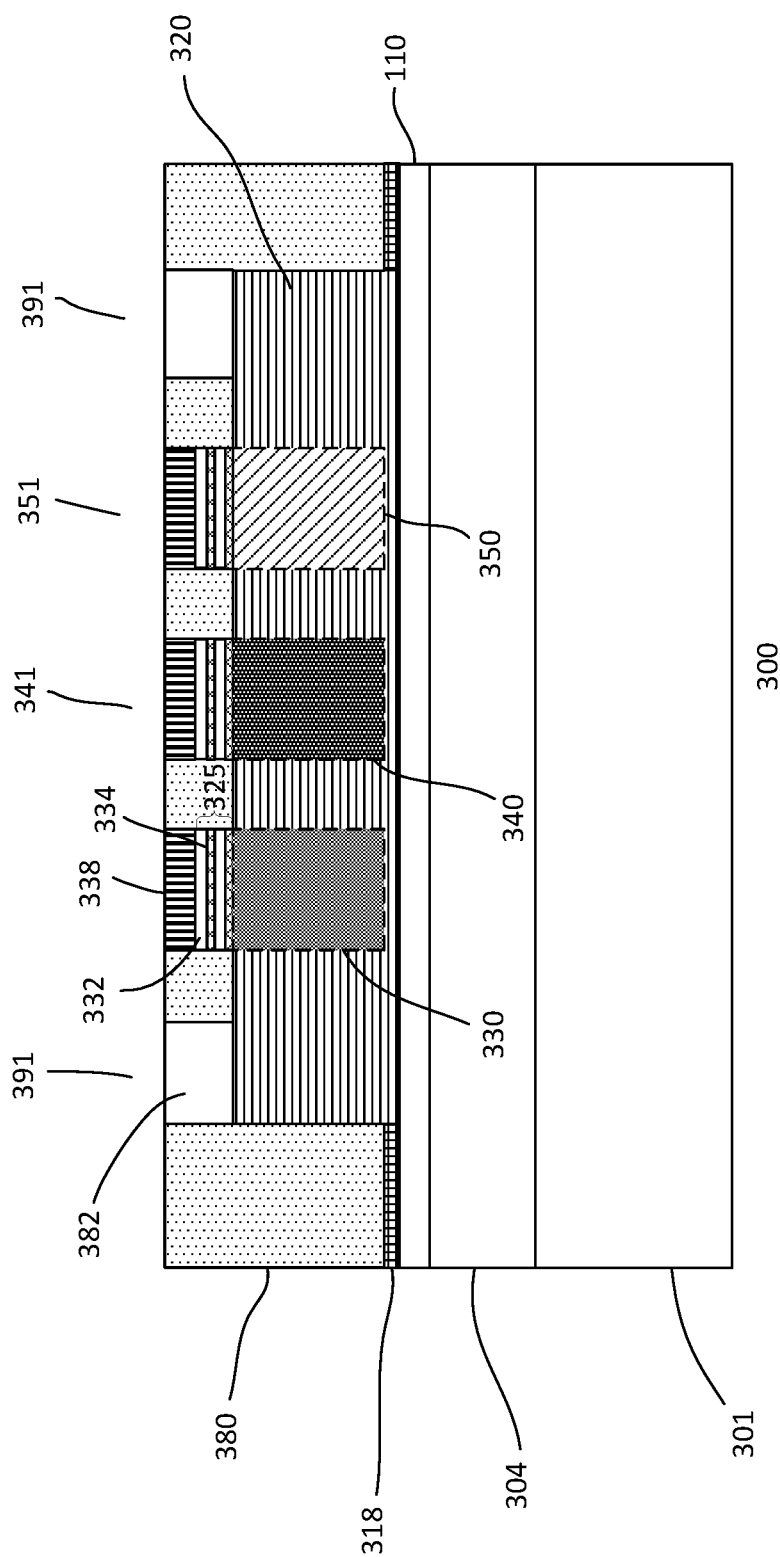

Referring to FIG. 3j, the process continues to form the G LEDs 340. The process is similar to that described in forming the B LEDs. For example, the process includes exposing the G LED region of the fin body, forming G MQW on the exposed fin body in the G LED region and forming a sealing dielectric layer over the G MQW LED.

As discussed, the InGaN layer of a G LED has a G bandgap. In one embodiment, a percentage (atomic percentage) x of In in the $In_xGa_{1-x}N$ layer of the G MQW is about 25-30%. Providing other percentages of In in the InGaN layer may also be useful.

Figure 3K:
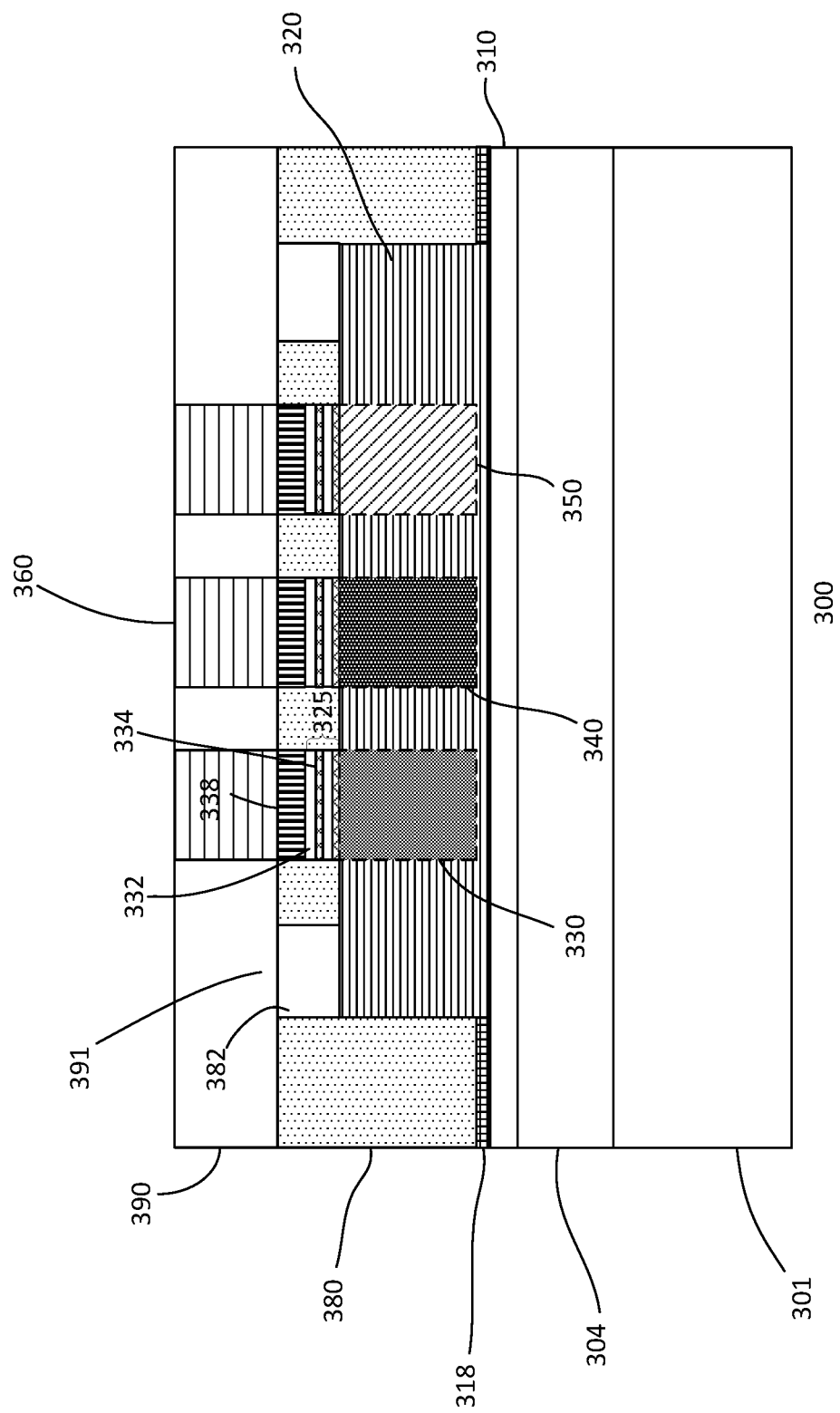
Figure 3I:
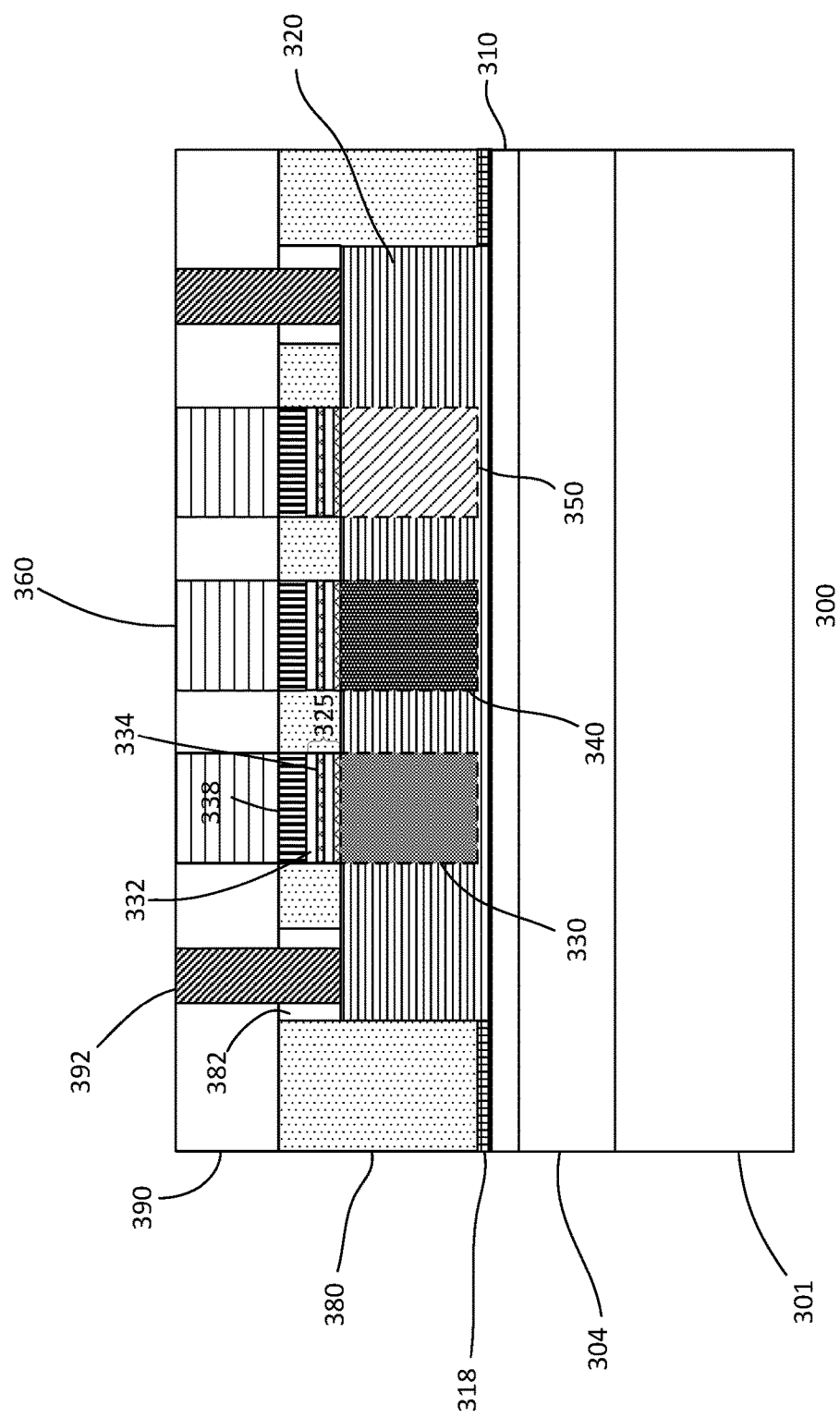

The process continues to form the R LEDs 350, as shown in FIG. 3k. The process is similar to that described in forming the B and G LEDs. For example, the process includes exposing the R LED region of the fin body, forming R MQW on the exposed fin body in the R LED region and forming a sealing dielectric layer over the R MQW LED.

As discussed, the InGaN layer of a R LED has a R bandgap. In one embodiment, a percentage (atomic percentage) x of In of the $In_xGa_{1-x}N$ layer of the R MQW is about 35-40%. Providing other percentages of In in the InGaN layer may also be useful.

As described, the process forms B LEDs first, followed by G LEDs and then R LEDs. The sequence is determined by the thermal cycle needed for forming the LEDs. In one embodiment, the sequence is from the highest thermal cycle to the lowest thermal cycle. This reduces the impact on the LEDs with lower required thermal cycle.

Referring to FIG. 3l, the sealing dielectric layer is removed. Removing the sealing dielectric layer exposes the LEDs. The process continues to form top LED layers over the LEDs. In one embodiment, an EBL (not shown) is form on top of the MQW prior to forming the top layer. The EBL may be an undoped layer. The EBL, for example, may be an undoped GaN or AlGaN layer. Other types of EBLs may also be useful. The top LED layers 338 are formed for the R, G and B LEDs. A top LED layer surrounds a MWQ of an LED. The top LED layers may be formed by SEG. The top LED layers may also be formed by MOCVD or MBE. The top LED layers are selectively formed on the MQWs of the LEDs. The top LED layers, in one embodiment, are second polarity doped GaN layers. For example, the top LED layers are p-GaN layers. The dopant concentration of the top LED layers may be $\geq 1E19$ atoms/cm$^3$. Other dopant concentrations for the top LED layers may also be useful. Doping the top LED layers may be achieved by in-situ doping during epitaxial growth or ion implantation after formation. The top of an LED is the top surface of the top LED layer over a fin body.

A fill dielectric layer may be formed over the substrate. The fill dielectric fills the gaps and covers the substrate over the LEDs. The fill dielectric layer, in one embodiment, is silicon oxide formed by CVD. Other types of fill dielectric layers may also be useful. Excess fill dielectric material is removed by, for example, CMP, forming a planar top surface with the top LED layers over the LEDs.

An interconnect dielectric layer 390 is formed on the substrate. The dielectric layer covers the substrate, including the pixel and fill dielectric layers as well as the top LED layers. Since the underlying surface is planar, a planarizing process may not be necessary after forming the interconnect dielectric layer. However, it is understood that a planarizing process, such as CMP, may nevertheless be performed.

The interconnect dielectric layer is patterned to form openings which exposes the R, G and B LEDs. For example, the sealing dielectric layer is removed from over the R, G and B LEDs. The patterning of the interconnect dielectric layer also removes portions of the interconnect dielectric layer to provide column connections for LEDs of the pixel with the same color. For example, the patterning removes portions of the interconnect dielectric layer to expose the mask layer below to provide column connections for LEDs of the pixel with the same color. The interconnect dielectric layer is patterned by mask and etch processes.

A TCO layer 360 is formed on the substrate, covering and filling the openings resulting from patterning the interconnect dielectric layer. The TCO layer may be an ITO layer. Other types of TCO or transparent conductive layers may also be useful. The TCO layer may be formed by sputtering. Other techniques for forming the TCO layer may also be useful. Excess TCO material is removed by, for example, CMP.

Contacts are formed to contact regions 391 on the substrate. The contacts may be formed by etching via openings in the first contact dielectric layer, filling it with a conductive material, such as Al or W. Other types of conductive materials may also be useful. Excess conductive material may be removed by, for example CMP, forming the contacts. As shown, contacts 392 are formed to the fin bodies. In addition, contacts are formed to the TCO in TCO contact regions, forming common connections for LEDs of the same color in the column direction.

The device may include additional back-end-of-line layers. For example, additional interlevel dielectric (ILD) layers may be included. An ILD layer includes a contact level with via contacts and metal level with metal lines. An ILD layer may be formed using various processes. For example, single damascene, dual damascene, and/or reactive ion etch techniques may be employed. Other techniques may also be employed to form the ILD layers. The contacts may be W or copper contacts while the metal lines may be copper lines. Other types of contacts and metal lines may also be useful. The ILD layers may provide interconnect routings for the device without obscuring the LEDs. A passivation layer may be disposed over the top of the ILD layers.

FIGS. 4a-4i show cross-sectional views of another embodiment of a process for forming a device 400. The device, for example, is similar to that described in FIGS. 1a-1c, FIGS. 2a-2b and FIGS. 3a-3l. Common elements may not be described or described in detail.

Figure 4A:
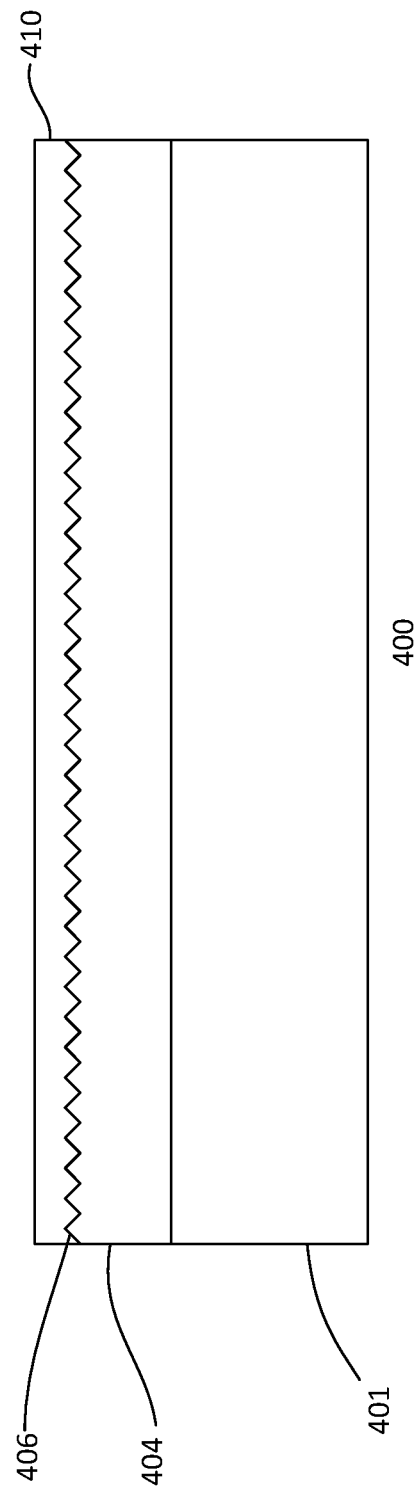
FIGS. 4a-4i show cross-sectional views of another process for forming a device.

Referring to FIG. 4a, a substrate 401 is provided. The substrate may be a bulk semiconductor substrate, such as a silicon (Si) substrate. In one embodiment, the substrate is a Si(111) substrate. Alternatively, the substrate may be a Si(100) substrate. In other embodiments, the substrate may be a silicon carbide (SiC) or a sapphire substrate. Other types of substrates, such as COI substrates may be used as well.

The substrate is prepared with a device well 404. The device well is a doped well. The doped device well, in one embodiment, is heavily doped with first polarity type dopants. In one embodiment, the doped device well is a heavily doped n-type (n$^+$) device well. In the case of a Si(100) substrate, it may be processed to form V-grooves 406 to expose the (111) surface in the Si(100) substrate.

A base layer 410 is formed over the substrate. The base layer may be a composite base layer having multiple layers. In one embodiment, the base layer includes a buffer layer and a nucleation layer. The nucleation layer is disposed on the substrate and the buffer layer is disposed on the nucleation layer. The buffer layer may be a GaN layer and the nucleation layer may be an AlN layer.

Figure 4B:
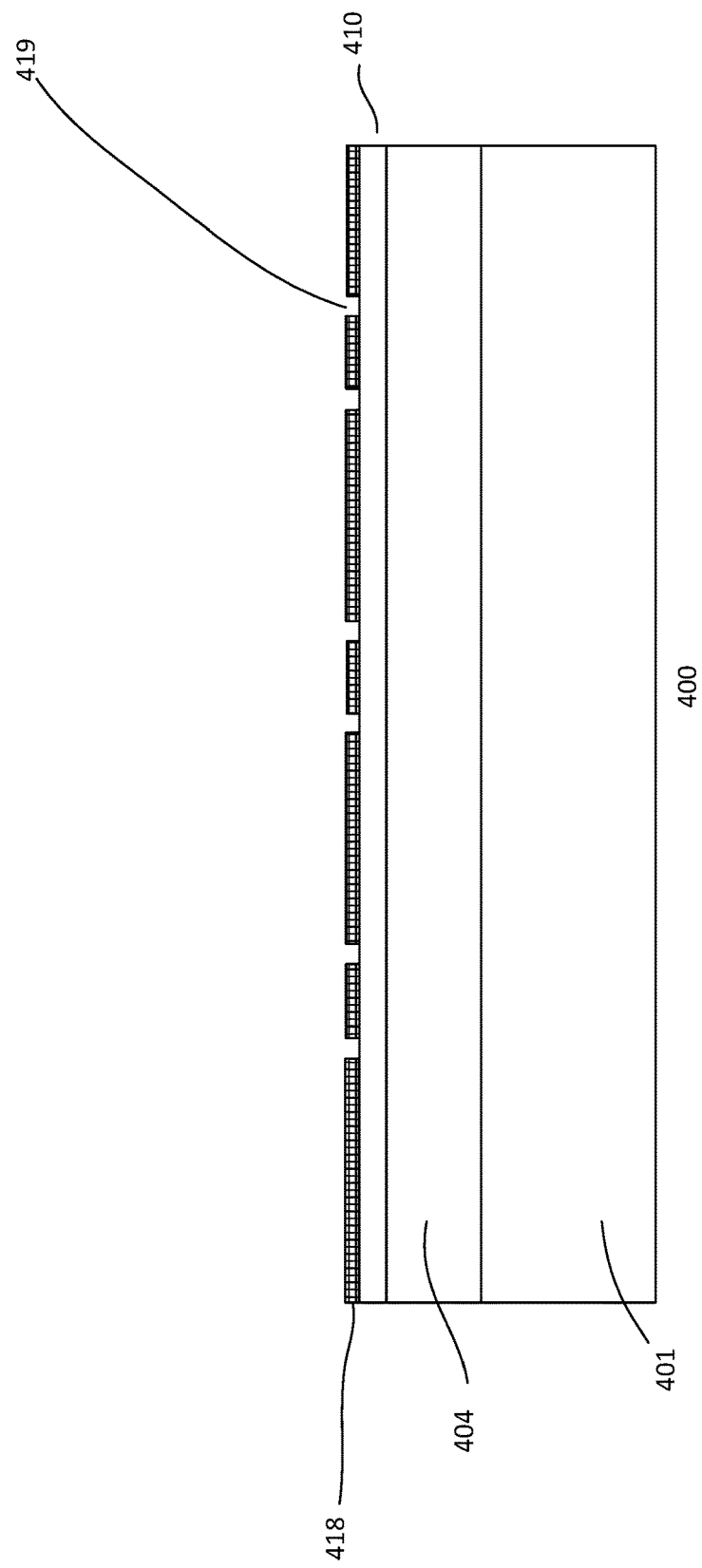

In FIG. 4b, a mask layer 418 is formed on the substrate. The mask layer, in one embodiment, is a SiN layer. A pad oxide layer may be formed on the substrate surface before forming the mask layer. The mask layer is patterned to form an opening 419 corresponding to where nanowire bodies are to be formed.

Figure 4C:
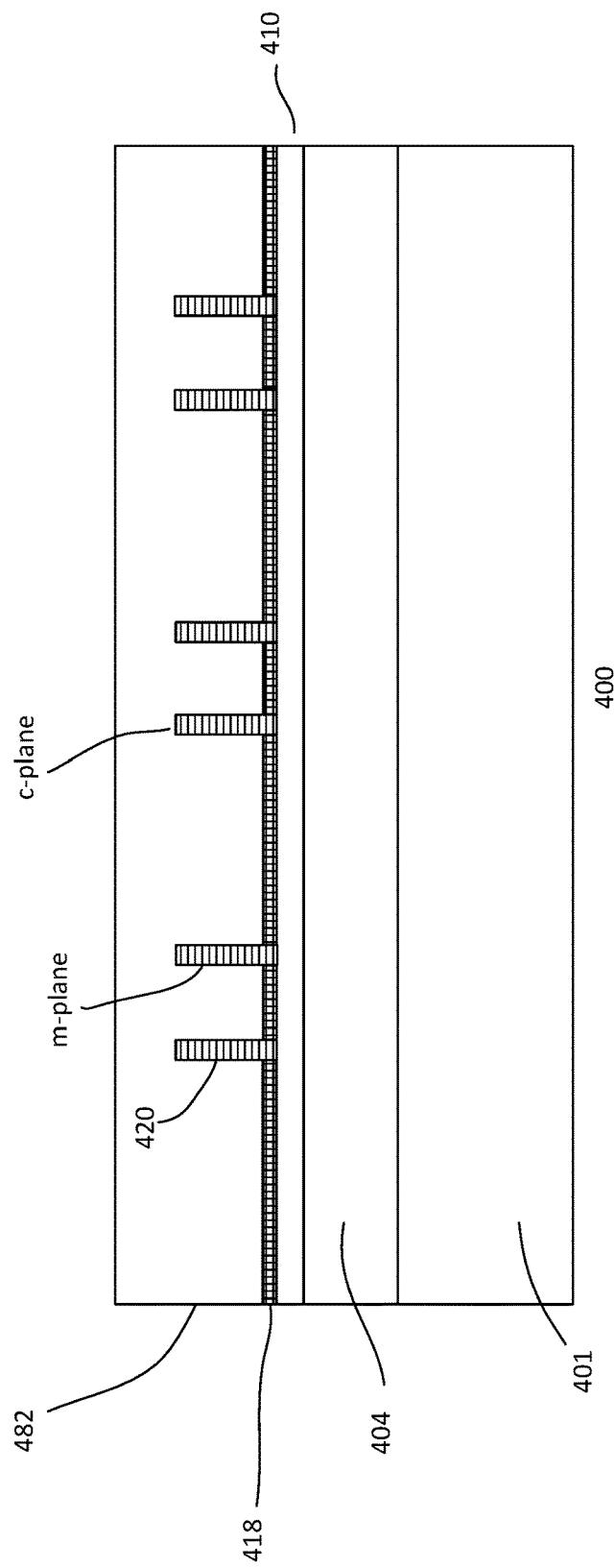

As shown in FIG. 4c, nanowire bodies 420 are formed on the substrate. In one embodiment, the nanowire bodies are formed in the opening in the mask layer. The nanowire bodies are GaN bodies formed by SEG. In one embodiment, the nanowire bodies are first polarity type doped GaN bodies. In one embodiment, the bodies are n-GaN fin bodies. Doping the bodies may be achieved by in-situ doping during epitaxial growth or ion implantation after formation. As shown, sidewalls of the bodies are along a m-plane and tops of the bodies are along a c-plane.

A processing dielectric layer 482 is formed on the substrate, covering the bodies. In one embodiment, the dielectric layer may be a silicon layer. Other types of dielectric layers may also be useful. The dielectric layer may be formed by CVD. A planarizing or polishing process, such as chemical mechanical polishing (CMP), is performed to form a planar top surface for the isolation layer. The dielectric layer has a height which is above the bodies.

Figure 4D:
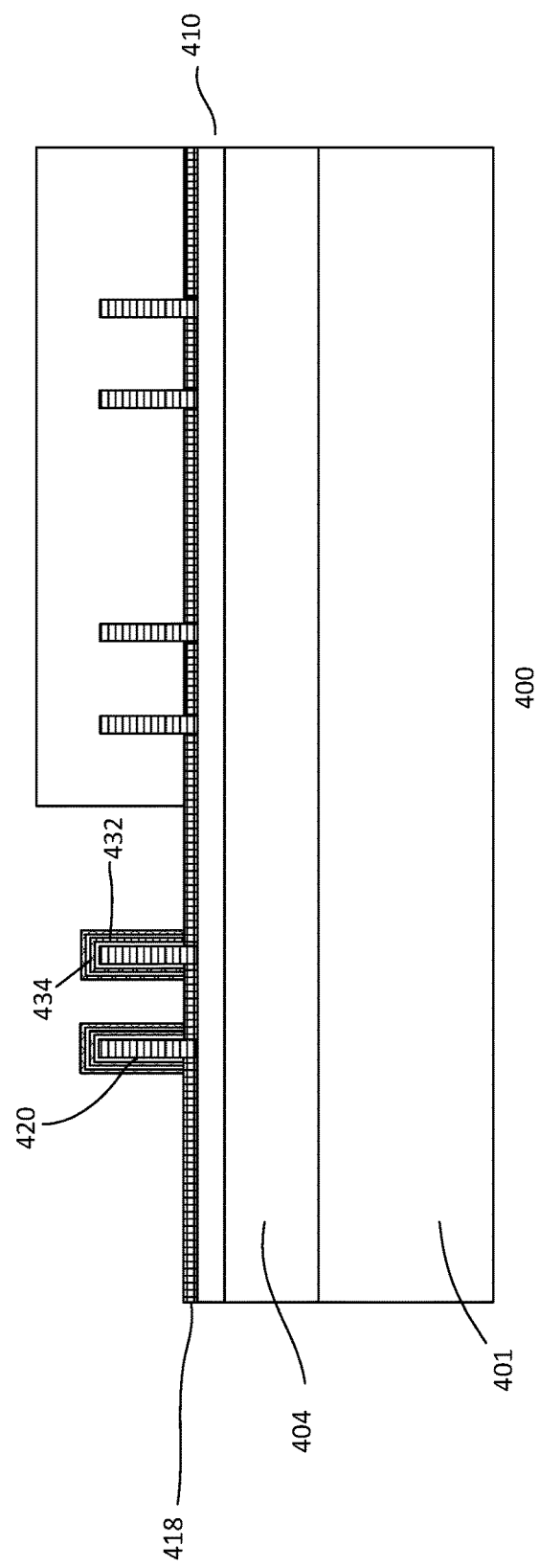

In FIG. 4d, the processing dielectric layer is patterned to expose nanowire bodies of the B LED module. Patterning the processing dielectric layer is achieved by, for example, mask and etch techniques.

The process proceeds to form a MQW on B nanowire bodies of the B LED module. For example, the process forms a B MQW for the B LEDs. As previously discussed, a QW includes a well layer sandwiched between two barrier layers. In one embodiment, the MQW includes two or more QWs, typically 4-6 QWs. Forming other number of QWs for the MQW may also be useful. As shown, a first well layer 432 is formed over the exposed B LED bodies. The first well layer surrounds the B LED bodies, including the top. A first barrier layer 434 is formed over the first well layer. In one embodiment, the first well layer is an InGaN layer and the first barrier layer is a GaN layer. The body serves as a barrier layer. The body and the first barrier layer sandwiches the first well layer to form the first QW. A second well layer, such as InGaN and a second barrier layer, such as GaN, are formed over the first QW. The first barrier layer, the second well layer and the second barrier layer serves as the second QW. As such, the MQW includes alternating layers of InGaN 432 and GaN 434 disposed over the exposed nanowire bodies in B LED region.

In one embodiment, the layers of the B MQW are formed by SEG. For example, the layers of the MQW are selectively formed on the bodies. The mask layer and processing dielectric layer prevents the formation of the MQW layers except on the exposed B nanowire bodies. In one embodiment, the first InGaN layer is selectively formed on the bodies. The GaN layer is selectively formed on the InGaN layer. For an additional MQW layer, it is formed on an underlying MQW layer. The thickness of the InGaN layer may be about 3 nm and the GaN layer may be about 12 nm. Other thicknesses may also be useful.

As discussed, the InGaN layer of a B LED has a B bandgap. In one embodiment, a percentage (atomic percentage) of In in the $In_xGa_{1-x}N$ layer of the B MQW is about 15-20%. Providing other percentages of In in the InGaN layer may also be useful.

After forming the B LEDs, a dielectric layer is deposited on the substrate, filling the B LED area. The dielectric layer may be a silicon oxide layer formed by CVD. A polishing process, such as CMP is performed. This, for example, provides a processing dielectric layer over the substrate covering the unprocessed as well as processed nanowire bodies.

Figure 4E:
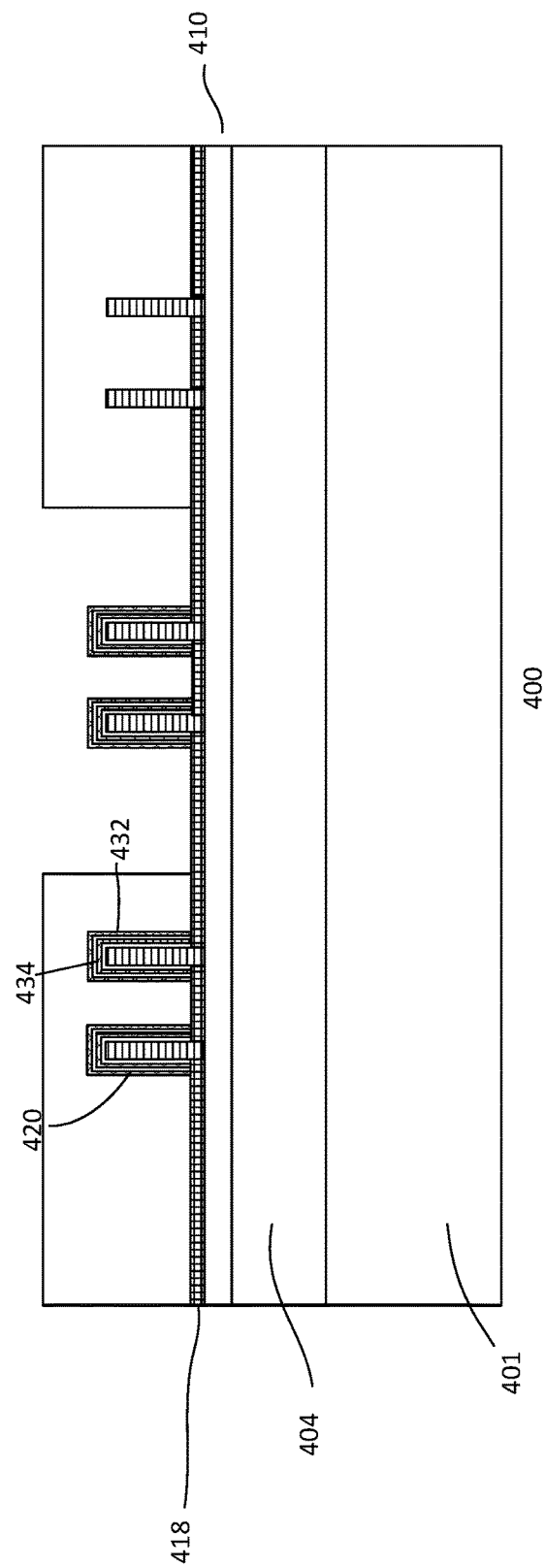

Referring to FIG. 4e, the processing dielectric layer is patterned to expose nanowire bodies of the G LED module. Patterning the processing dielectric layer is achieved by, for example, mask and etch techniques.

The process proceeds to form a G MQW on G nanowire bodies of the G LED module. For example, the process forms a G MQW for the G LEDs, similar to the B MQWs. As discussed, the InGaN layer of a G LED has a G bandgap. In one embodiment, a percentage (atomic percentage) x of In in the $In_xGa_{1-x}N$ layer of the G MQW is about 25-30%. Providing other percentages of In in the InGaN layer may also be useful. After forming the G LEDs, a dielectric layer is deposited on the substrate, filling the G LED area. A polishing process, such as CMP is performed.

Figure 4F:
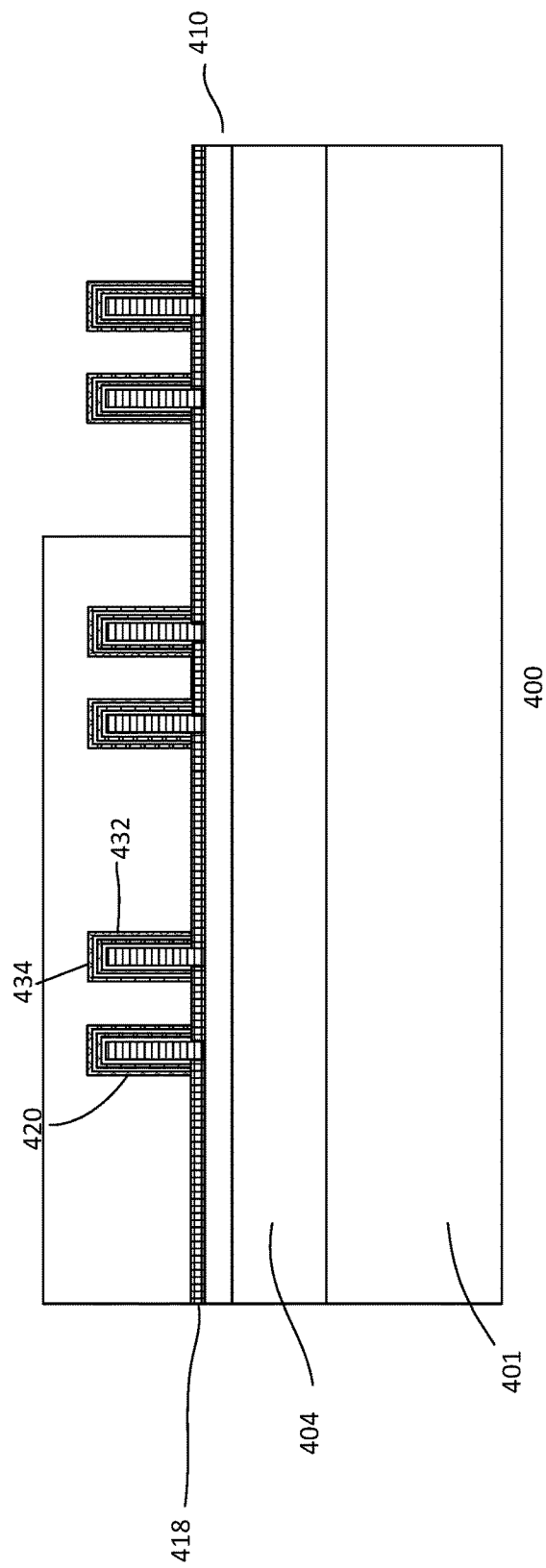

The process continues to form the R LEDs, as shown in FIG. 4f. The process includes patterning the processing dielectric layer to expose nanowire bodies of the R LED module. Patterning the processing dielectric layer filling the B and G LED areas is achieved by, for example, mask and etch techniques. A R MQW is formed on the exposed R nanowire bodies, similar to that of the B and G MQWs. As discussed, the InGaN layer of a R LED has a R bandgap. In one embodiment, a percentage (atomic percentage) x of In in the $In_xGa_{1-x}N$ layer of the R MQW is about 35-40%. Providing other percentages of In in the InGaN layer may also be useful. After forming the R LEDs, the remaining processing dielectric layer is removed. For example, the remaining processing dielectric layer may be removed by a wet etch. The wet etch is selective to the mask layer and MQWs.

As described, the process forms B LEDs first, followed by G LEDs and then R LEDs. The sequence is determined by the thermal cycle needed for forming the LEDs. In one embodiment, the sequence is from the highest thermal cycle to the lowest thermal cycle. This reduces the impact on the LEDs with lower required thermal cycle.

Figure 4G:
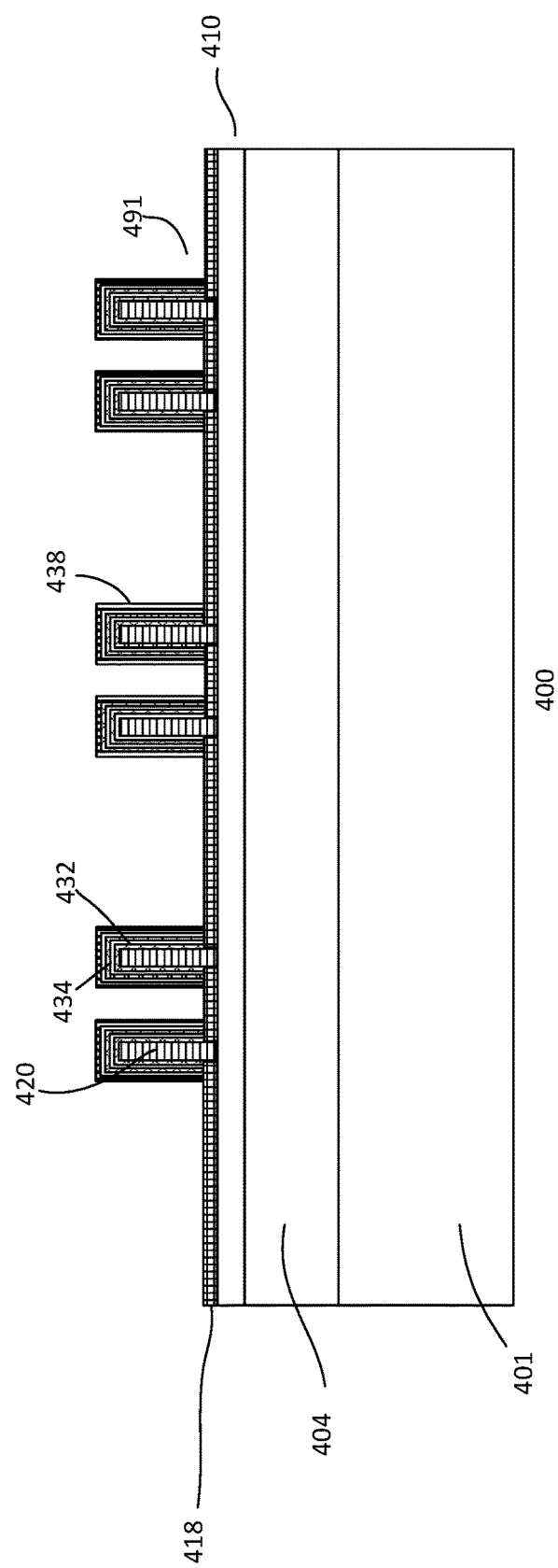

Referring to FIG. 4g, the process continues to form top LED layers 438 over the LEDs. For example, top LED layers are formed for the R, G and B LEDs. A top LED layer surrounds an MWQ of the LED. The top LED layers may be formed by SEG. For example, the top LED layers selectively form of the MQWs of the LEDs. The top LED layers, in one embodiment, are second polarity doped GaN layers. For example, the top LED layers are p-GaN layers. The dopant concentration of the top LED layers may be $\geq$1E19 atoms/$cm^3$. Other dopant concentrations for the top LED layers may also be useful. Doping the top LED layers may be achieved by in-situ doping during epitaxial growth or ion implantation after formation.

Figure 4H:
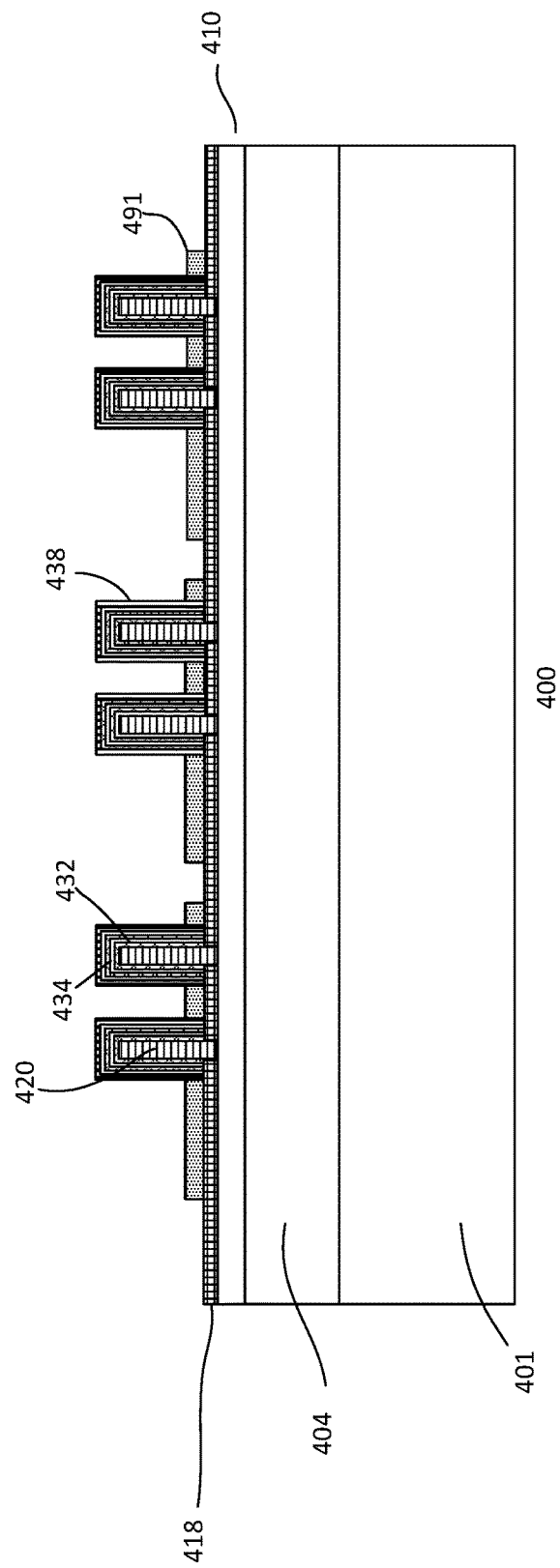

In FIG. 4h, conductive plates 491 are formed on the substrate for the LED modules. For example, a conductive plate is formed for each LED module. The conductive plate may be an Al or W conductive plate. Other types of conductive plates, such as copper or copper alloy may also be useful. In one embodiment, to form the conductive plates, a conductive layer is formed on the substrate. The conductive layer may be formed by sputtering. Other techniques for forming the conductive layer, such as plating may also be useful. The conductive layer may fill the gaps and cover the top of the LEDs. A planarizing process, such as CMP, may be performed to provide a planar top surface. An etch back may be performed to recess the conductive layer. The etch back, for example, may be selective to the LEDs. The etch back recesses the conductive layer to a desired thickness. The thickness of the conductive layer, for example, may be about 0.25 um. Other thicknesses may also be useful. The conductive layer is disposed over the mask layer 418 and surrounds a lower portion of the nanowire LEDs. The conductive layer is patterned using, for example, mask and etch techniques to form the conductive plates.

Figure 4I:
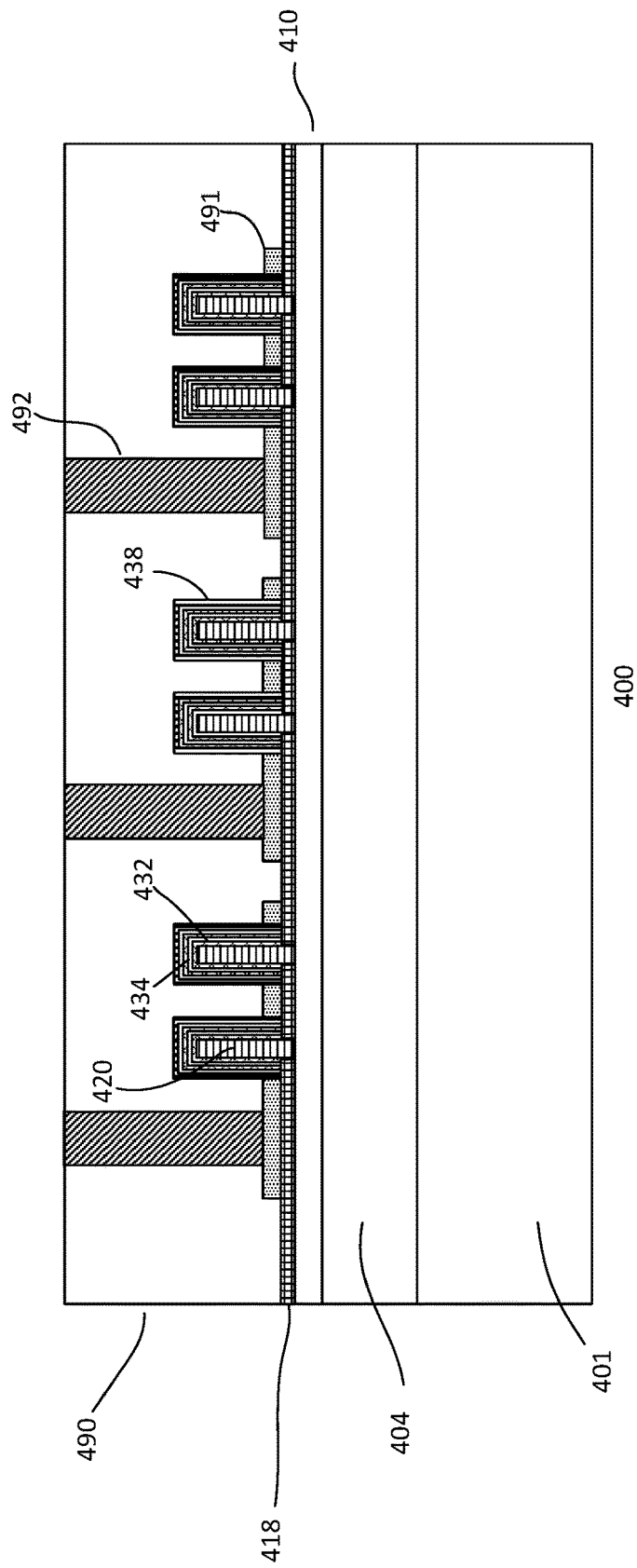

An interconnect dielectric layer 490, as shown in FIG. 4i, is formed over the substrate. The interconnect dielectric layer may be silicon oxide formed by CVD. Other types of dielectric layers may also be useful. The dielectric layer fills the gaps and covers the LEDs. The interconnect dielectric may be planarized, such as by CMP, to provide a planar top surface over the LEDs.

The interconnect dielectric layer is patterned to form openings which exposes contact regions on the conductive plates of the R, G and B LEDs. Patterning the interconnect dielectric layer also exposes the contact regions to the device well. Patterning the interconnect dielectric layer is achieved by etch and mask techniques.

A conductive layer, such as Al or W, is formed over the substrate, filling the openings in the interconnect dielectric layer. Other types of conductive layers may also be formed. The conductive layer may be formed by sputtering or other forming techniques. Excess conductive material may be removed by, for example, CMP, forming contacts 492 to the conductive plates of the LED modules and the device well.

The device may include additional back-end-of-line (BEOL) layers. For example, additional interlevel dielectric (ILD) layers may be included. An ILD layer includes a contact level with via contacts and metal level with metal lines. An ILD layer may be formed using various processes. For example, single damascene, dual damascene, and/or reactive ion etch techniques may be employed. Other techniques may also be employed to form the ILD layers. The contacts may be W or copper contacts while the metal lines may be copper lines. Other types of contacts and metal lines may also be useful. The ILD layers may provide interconnect routings for the device without obscuring the LEDs. A passivation layer may be disposed over the top of the ILD layers.

The present disclosure may be embodied in other specific forms without departing from the spirit or essential characteristics thereof. The foregoing embodiments, therefore, are to be considered in all respects illustrative rather than limiting the invention described herein. The scope of the disclosure is thus indicated by the appended claims, rather than by the foregoing description, and all changes that come within the meaning and range of equivalency of the claims are intended to be embraced therein.

The invention claimed is:

1. A device comprising:
a substrate;
a light emitting diode (LED) body disposed on the substrate, wherein the LED body comprises a fin body, the fin body being an elongated member disposed in a row direction;
a multiple quantum well (MQW) disposed on the LED body;
a top LED layer disposed on the MQW; and
wherein the LED body, the MQW and the top LED layer form an LED.

2. The device of claim 1, wherein the LED comprises a red LED.

3. The device of claim 2, wherein the MQW comprises at least an indium gallium nitride ($In_xGa_{1-x}N$) layer and a gallium nitride (GaN) layer, where x is an atomic percentage of In in the $In_xGa_{1-x}N$ layer and is selected to produce a red bandgap.

4. The device of claim 3, wherein x is about 35-40%.

5. The device of claim 1, wherein the LED comprises a green LED.

6. The device of claim 5, wherein the MQW comprises at least an $In_xGa_{1-x}N$ layer and a GaN layer, where x is an atomic percentage of In in the $In_xGa_{1-x}N$ layer and is selected to produce a green bandgap.

7. The device of claim 6, wherein x is about 25-30%.

8. The device of claim 1, wherein the LED comprises a blue LED.

9. The device of claim 8, wherein the MQW comprises at least an $In_xGa_{1-x}N$ layer and a GaN layer, where x is an atomic percentage of In in the $In_xGa_{1-x}N$ layer and is selected to produce a blue bandgap.

10. The device of claim 9, wherein x is about 15-20%.

11. A device comprising:
a substrate;
a light emitting diode (LED) body disposed on the substrate;
a multiple quantum well (MOW) disposed on the LED body;
a top LED layer disposed on the MQW; and
wherein
the LED body, the MOW and the top LED layer form an LED,
the substrate comprises a surface plane with a (111) crystal orientation, and
the LED body comprises an epitaxial layer, wherein sides of the LED body are along an m-plane and a top of the LED body is along a c-plane.

12. The device of claim 1, wherein:
the LED body comprises a red LED body for a red LED disposed on a red region on the substrate, a green LED body for a green LED disposed on a green region on the substrate and a blue LED body for a blue LED disposed on a blue region on the substrate;
the MQW comprises a red MQW disposed on the red LED body, a green MQW disposed on the green LED body and a blue MQW disposed on the blue LED body;
the top LED layer comprises a red top layer disposed on the red MQW, a green top layer disposed on the green MQW and a blue top layer disposed on the blue MQW; and
the LED body, the MQW and the top LED layer form a colored LED pixel.

13. The device of claim 12, wherein:
the red MQW comprises at least a red $In_xGa_{1-x}N$ layer and a red GaN layer, where x is an atomic percentage of In in the red $In_xGa_{1-x}N$ layer and is selected to produce a red bandgap;
the green MQW comprises at least a green $IN_xGa_{1-x}N$ layer and a GaN layer, where x is the atomic percentage of In in the green $In_xGa_{1-x}N$ layer and is selected to produce a green bandgap; and
the blue MQW comprises at least a blue $In_xGa_{1-x}N$ layer and a blue GaN layer, where x is the atomic percentage of In in the blue $In_xGa_{1-x}N$ layer and is selected to produce a blue bandgap.

14. The device of claim 13, wherein:
x for the blue $In_xGa_{1-x}N$ layer is about 15-20%;
x for the green $In_xGa_{1-x}N$ layer is about 25-30%; and
x for the red $In_xGa_{1-x}N$ layer is about 35-40%.

15. The device of claim 12, wherein:
the colored LED pixel comprises a fin-type LED pixel having the fin body which serves as a common fin body for the red LED, the green LED and the blue LED;
the fin body includes
the red region which serves as the red LED body,
the green region which serves as the green LED body, and
the blue region which serves as the blue LED body; and
the fin body with the red LED, the green LED and the blue LED forms an LED unit of the colored LED pixel.

16. A device comprising:
a substrate;
a light emitting diode (LED) body disposed on the substrate, wherein the LED body comprises a nanowire body;
a multiple quantum well (MQW) disposed on the LED body;
a top LED layer disposed on the MOW; and
wherein the LED body, the MQW and the top LED layer form an LED.

17. The device in claim 15, wherein the colored LED pixel comprises:
a plurality of LED units in the row direction, wherein red LEDs of the LED units are aligned in a column direction, green LEDs of the LED units are aligned in the column direction and blue LEDs of the LED units are aligned in the column direction; and
transparent conductive oxide (TCO) layers are disposed over the LEDs and are separated by an interconnect dielectric layer, wherein a TCO layer serves to couple same color LEDs of the LED units in the column direction.

18. The device of claim 16, wherein:
the LED body comprises a red LED body for a red LED disposed on a red region on the substrate, a green LED body for a green LED disposed on a green region on the substrate and a blue LED body for a blue LED disposed on a blue region on the substrate;
the MOW comprises a red MOW disposed on the red LED body, a green MOW disposed on the green LED body and a blue MOW disposed on the blue LED body;
the top LED layer comprises a red top layer disposed on the red MOW, a green top layer disposed on the green MOW and a blue top layer disposed on the blue MOW; and
wherein the red LED body comprises a red nanowire body for the red LED, the green LED body comprises a green nanowire body for the green LED, and the blue LED body comprises a blue nanowire body for the blue LED.

19. The device of claim 18, wherein the red nanowire body, the green nanowire body and the blue nanowire body have different cross-sectional diameters to incorporate different percentages (atomic percentages) of In, wherein:
a cross-sectional diameter of the red nanowire body is less than about 100 nm;
a cross-sectional diameter of the green nanowire body is about 200 nm; and
a cross-sectional diameter of the blue nanowire body is greater than about 300 nm.

20. A method for forming a device comprising:
providing a substrate;
forming a light emitting diode (LED) body on the substrate, wherein the LED body comprises a fin body or a nanowire body;
forming a multiple quantum well (MQW) on the LED body; and
forming a top LED layer on the MQW, wherein the LED body, the MQW and the top LED layer form an LED.

* * * * *

UNITED STATES PATENT AND TRADEMARK OFFICE
CERTIFICATE OF CORRECTION

PATENT NO. : 10,199,429 B2
APPLICATION NO. : 15/901850
DATED : February 5, 2019
INVENTOR(S) : Srinivasa Banna et al.

It is certified that error appears in the above-identified patent and that said Letters Patent is hereby corrected as shown below:

In the Claims

Column 17, Claim 11, Line 62, change "MOW" to --MQW--.

Column 17, Claim 11, Line 66, change "MOW" to --MQW--.

Column 18, Claim 16, Line 56, change "MOW" to --MQW--.

Column 19, Claim 18, Line 10, change two instances of "MOW" to --MQW--.

Column 19, Claim 18, Line 11, change "MOW" to --MQW--.

Column 19, Claim 18, Line 12, change "MOW" to --MQW--.

Column 19, Claim 18, Line 14, change "MOW" to --MQW--.

Column 19, Claim 18, Line 15, change two instances of "MOW" to --MQW--.

Signed and Sealed this
Nineteenth Day of March, 2019

Andrei Iancu
*Director of the United States Patent and Trademark Office*